(12) United States Patent
Lee et al.

(10) Patent No.: US 10,490,608 B2
(45) Date of Patent: Nov. 26, 2019

(54) DISPLAY DEVICE AND METHOD FOR FABRICATING THE SAME

(71) Applicant: SAMSUNG DISPLAY CO., LTD., Yongin-si, Gyeonggi-do (KR)

(72) Inventors: Sungeun Lee, Seoul (KR); Junghyun Kim, Suwon-si (KR); Jintaek Kim, Yongin-si (KR); Kiwan Ahn, Seoul (KR); Joosun Yoon, Seoul (KR); Kwangyoung Choi, Incheon (KR)

(73) Assignee: Samsung Display Co., Ltd. (KR)

( * ) Notice: Subject to any disclaimer, the term of this patent is extended or adjusted under 35 U.S.C. 154(b) by 23 days.

(21) Appl. No.: 15/654,448

(22) Filed: Jul. 19, 2017

(65) Prior Publication Data
US 2018/0026081 A1 Jan. 25, 2018

(30) Foreign Application Priority Data

Jul. 21, 2016 (KR) ........................ 10-2016-0092562

(51) Int. Cl.
*H01L 27/32* (2006.01)
*G02F 1/1343* (2006.01)
(Continued)

(52) U.S. Cl.
CPC ........ *H01L 27/3223* (2013.01); *G02F 1/1368* (2013.01); *G02F 1/13439* (2013.01); *G02F 1/134309* (2013.01); *G02F 1/136213* (2013.01); *G02F 1/136286* (2013.01); *H01L 27/3248* (2013.01); *H01L 27/3258* (2013.01); *H01L 27/3265* (2013.01); *H01L 27/3276* (2013.01); *G02F 1/136227* (2013.01); *G02F 2001/133357* (2013.01); *G02F 2201/121* (2013.01); *G02F 2201/123* (2013.01); *G02F 2202/10* (2013.01);
(Continued)

(58) Field of Classification Search
None
See application file for complete search history.

(56) References Cited

U.S. PATENT DOCUMENTS 8,654,158 B2  2/2014 Tsai et al.
2011/0254883 A1* 10/2011 Tsai .................... G09G 3/3233
                                                             345/691
(Continued)

FOREIGN PATENT DOCUMENTS

KR  10-2015-0080201    *  7/2015
KR  10-2015-0080201 A    7/2015
(Continued)

*Primary Examiner* — Ryan Crockett
(74) *Attorney, Agent, or Firm* — Innovation Counsel LLP

(57) ABSTRACT

A display device is capable of preventing damage to a signal line in a dehydrogenation process of a semiconductor layer and to a method of manufacturing the display device, the display device including: a substrate; at least one switching element on the substrate; a pixel electrode connected to the at least one switching element; a semiconductor layer on the substrate, the semiconductor layer providing a channel area of the at least one switching element; an insulating layer on the semiconductor layer; and a conductive layer connected to the semiconductor layer through a contact hole of the insulating layer. The insulating layer has a groove that overlaps the semiconductor layer and surrounds the conductive layer in the contact hole.

18 Claims, 28 Drawing Sheets

(51) Int. Cl.
*G02F 1/1362* (2006.01)
*G02F 1/1368* (2006.01)
*G02F 1/1333* (2006.01)

(52) U.S. Cl.
CPC .... *H01L 27/3262* (2013.01); *H01L 2227/323* (2013.01)

(56) References Cited

U.S. PATENT DOCUMENTS

| | | | | |
|---|---|---|---|---|
| 2015/0029429 | A1* | 1/2015 | Choi | G02F 1/1368 349/43 |
| 2016/0209718 | A1* | 7/2016 | Lee | G02F 1/136227 |
| 2016/0334679 | A1* | 11/2016 | Choi | G02F 1/134309 |
| 2018/0286890 | A1* | 10/2018 | Suzumura | H01L 27/1248 |
| 2018/0286938 | A1* | 10/2018 | Moon | H01L 27/3262 |
| 2018/0314120 | A1* | 11/2018 | Peng | H01L 27/0288 |

FOREIGN PATENT DOCUMENTS

| | | | |
|---|---|---|---|
| KR | 10-2016-0008680 A | | 1/2016 |
| KR | 10-2016-0020664 | * | 2/2016 |
| KR | 10-2016-0020664 A | | 2/2016 |

\* cited by examiner

DISPLAY DEVICE AND METHOD FOR FABRICATING THE SAME

CROSS-REFERENCE TO RELATED APPLICATION

This application claims the priority to and all the benefits accruing under 35 U.S.C. § 119 of Korean Patent Application No. 10-2016-0092562, filed on Jul. 21, 2016, with the Korean Intellectual Property Office ("KIPO"), the disclosure of which is incorporated herein in its entirety by reference.

BACKGROUND

1. Field

Embodiments of the present inventive concept relate to a display device and a method of manufacturing the display device, and more particularly, to a display device that may effectively reduce (e.g., prevent) damage to a signal line in a dehydrogenation process of a semiconductor layer and to a method of manufacturing the display device.

2. Description of the Related Art

Light emitting diode ("LED") display devices include pixels, and each pixel includes an LED and a pixel circuit for driving the LED. The pixel circuit includes a plurality of switching elements.

In order to improve a threshold voltage of a switching element, dehydrogenation of a semiconductor layer is performed. However, due to a thermal treatment process during the dehydrogenation, a signal line may be damaged.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

Aspects of embodiments of the present inventive concept are directed to a display device capable of preventing damage to a signal line in a dehydrogenation process of a semiconductor layer and to a method of manufacturing the display device.

According to an exemplary embodiment of the present inventive concept, a display device includes: a substrate; at least one switching element on the substrate; a pixel electrode connected to the at least one switching element; a semiconductor layer on the substrate, the semiconductor layer providing a channel area of the at least one switching element; an insulating layer on the semiconductor layer; and a conductive layer connected to the semiconductor layer through a contact hole of the insulating layer. The insulating layer is defined with a groove that overlaps the semiconductor layer and surrounds the conductive layer in the contact hole; and a size of the groove is larger than a size of the contact hole.

The groove may have a ring shape surrounding the conductive layer.

The display device may further include another insulating layer on the insulating layer.

A portion of the another insulating layer in the groove may have a ring shape.

The insulating layer may include: a first insulating layer on the semiconductor layer, the first insulating layer defined with a dummy hole that surrounds the conductive layer in the contact hole and overlaps the groove; and a second insulating layer in the dummy hole and on the first insulating layer.

The dummy hole may have a ring shape surrounding the conductive layer in the contact hole.

A portion of the second insulating layer in the dummy hole may have a ring shape.

The at least one switching element may include: a gate electrode between the insulating layer and the substrate; and a source electrode or a drain electrode on the insulating layer, the source electrode or the drain electrode connected to the conductive layer.

The source electrode or the drain electrode may be unitary with the conductive layer.

The display device may further include: a common electrode on the pixel electrode; and a display element between the common electrode and the pixel electrode.

The display element may include an organic light emitting element or liquid crystals.

The display device may further include: a first capacitor connected to an initiating line on the insulating layer through one terminal of the first capacitor; a second capacitor connected between the pixel electrode and a data line; and a light emitting element connected between the pixel electrode and a common electrode.

The at least one switching element may include: a first switching element including a gate electrode connected to a gate line, the first switching element connected between the initiating line and the pixel electrode; a second switching element including a gate electrode connected to another terminal of the first capacitor, the second switching element connected between a driving power line and the pixel electrode; and a third switching element including a gate electrode connected to a scan line, the third switching element connected between the another terminal of the first capacitor and the pixel electrode.

According to an exemplary embodiment of the present inventive concept, a display device includes: a substrate; at least one switching element on the substrate; a pixel electrode connected to the at least one switching element; a semiconductor layer on the substrate, the semiconductor layer providing a channel area of the at least one switching element; and an insulating layer on the semiconductor layer, the insulating layer defined with a groove overlapping the semiconductor layer. The groove has a closed-loop shape, and the insulating layer includes: a first insulating layer on the semiconductor layer, the first insulating layer defined with a dummy hole overlapping the groove; and a second insulating layer in the dummy hole and on the first insulating layer, the second insulating layer defined with a groove having a less size than a size of the dummy hole.

The at least one switching element may include: a gate electrode between the insulating layer and the substrate; and a source electrode or a drain electrode on the insulating layer, the source electrode or the drain electrode connected to the semiconductor layer through a contact hole of the insulating layer.

According to an exemplary embodiment of the present inventive concept, a method of manufacturing a display device includes: forming a semiconductor layer on a substrate; forming a gate insulating layer on the semiconductor layer; forming a gate electrode on the gate insulating layer to overlap the semiconductor layer; forming a first insulating layer on the gate electrode and the gate insulating layer; defining a dummy hole in the first insulating layer, the dummy hole exposing the semiconductor layer; releasing hydrogen of the semiconductor layer through the dummy hole; and forming a second insulating layer in the dummy hole and on the first insulating layer.

The method may further include: defining a contact hole in the second insulating layer, the contact hole exposing the semiconductor layer; and forming a source electrode or a drain electrode on the second insulating layer, the source electrode or the drain electrode connected to the semiconductor layer through the contact hole.

The method may further include: forming a pixel electrode connected to the source electrode or the drain electrode, a light emitting element connected to the pixel electrode, and a common electrode connected to the light emitting element.

Releasing of the hydrogen of the semiconductor layer through the dummy hole may include thermal-treating the substrate defined with the dummy hole.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and aspects of the present disclosure of inventive concept will be more clearly understood from the following detailed description taken in conjunction with the accompanying drawings, in which.

DETAILED DESCRIPTION

Figure 1:
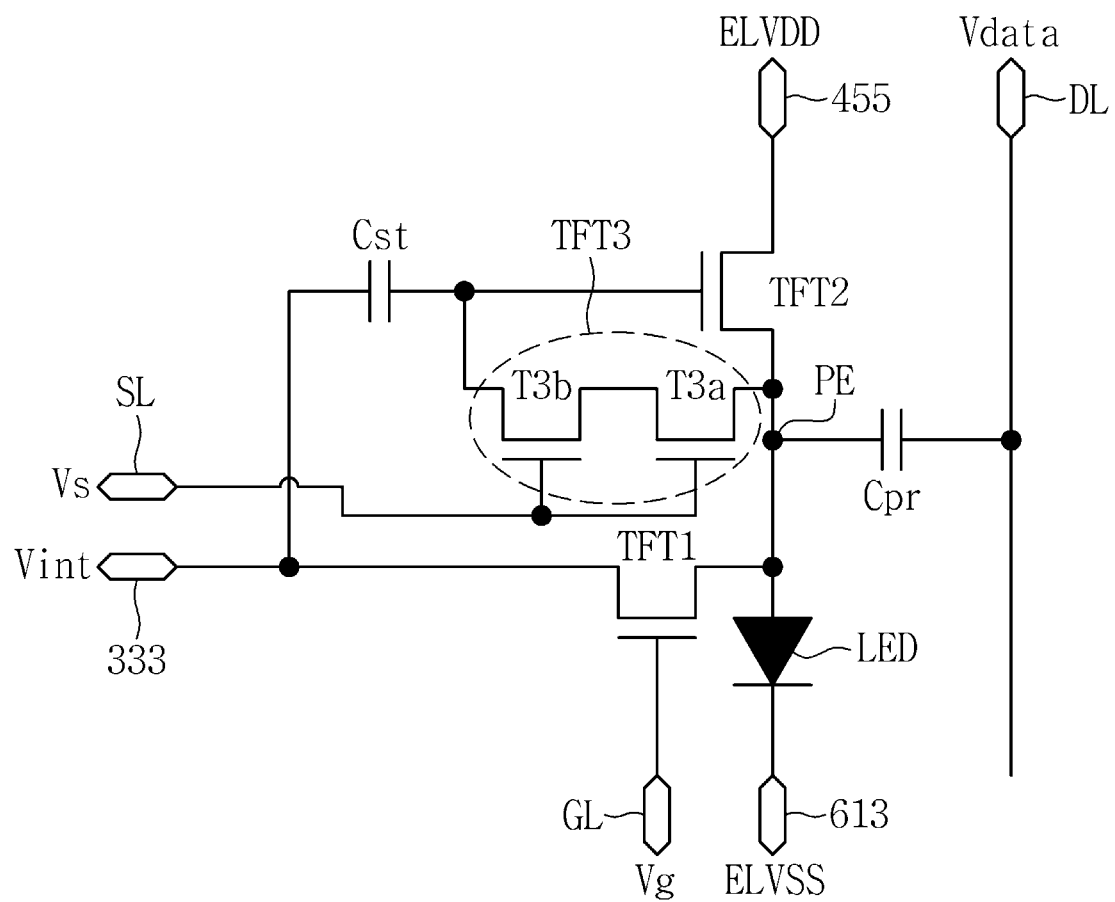
FIG. 1 is an equivalent circuit diagram illustrating a pixel of an exemplary embodiment of a display device.

Exemplary embodiments will now be described more fully hereinafter with reference to the accompanying drawings. Although the inventive concept can be modified in various manners and have several embodiments, exemplary embodiments are illustrated in the accompanying drawings and will be mainly described in the specification. However, the scope of the inventive concept is not limited to the exemplary embodiments and should be construed as including all the changes, equivalents, and substitutions included in the spirit and scope of the inventive concept.

In the drawings, thicknesses of a plurality of layers and areas are illustrated in an enlarged manner for clarity and ease of description thereof. When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "less", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" can be termed likewise without departing from the teachings herein.

Unless otherwise defined, all terms used herein (including technical and scientific terms) have the same meaning as commonly understood by those skilled in the art to which this inventive concept pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Some of the parts which are not associated with the description may not be provided in order to specifically describe embodiments of the present inventive concept, and like reference numerals refer to like elements throughout the specification.

Hereinafter, a display device and a method of manufacturing the display device will be described with reference to FIGS. 1 to 12H.

FIG. 1 is an equivalent circuit diagram illustrating a pixel of an exemplary embodiment of a display device.

As illustrated in FIG. 1, each pixel includes a first switching element TFT1, a second switching element TFT2, a third switching element TFT3, a first capacitor Cst, a second capacitor Cpr, and a light emitting diode ("LED"). The LED includes a light emitting layer.

The first capacitor Cst is connected between an initiating line 333 and a gate electrode of the second switching element TFT2.

The LED is connected between a pixel electrode PE and a common electrode 613. For example, the pixel electrode PE serves as an anode electrode of the LED, and the common electrode 613 serves as a cathode electrode of the LED. A direct current (DC) low voltage ELVSS is applied to the common electrode 613.

The second capacitor Cpr is connected between the pixel electrode PE and a data line DL.

The first switching element TFT1 includes the gate electrode connected to a gate line GL and is connected between the initiating line 333 and the pixel electrode PE.

The second switching element TFT2 includes a gate electrode connected to one terminal of the first capacitor Cst and is connected between a driving power line 455 and the pixel electrode PE. A DC high voltage ELVDD is supplied to the driving power line 455.

The third switching element TFT3 includes a gate electrode connected to a scan line SL and is connected between the gate electrode of the second switching element TFT2 and the pixel electrode PE. The third switching element TFT3 may be a dual switching element. For example, as illustrated in FIG. 1, the third switching element TFT3 may include two switching elements T3a and T3b that are connected to each other in series between the gate electrode of the second switching element TFT2 and the pixel electrode PE. Respective gate electrodes of the two switching elements T3a and T3b are connected to the scan line SL in common.

Figure 2:
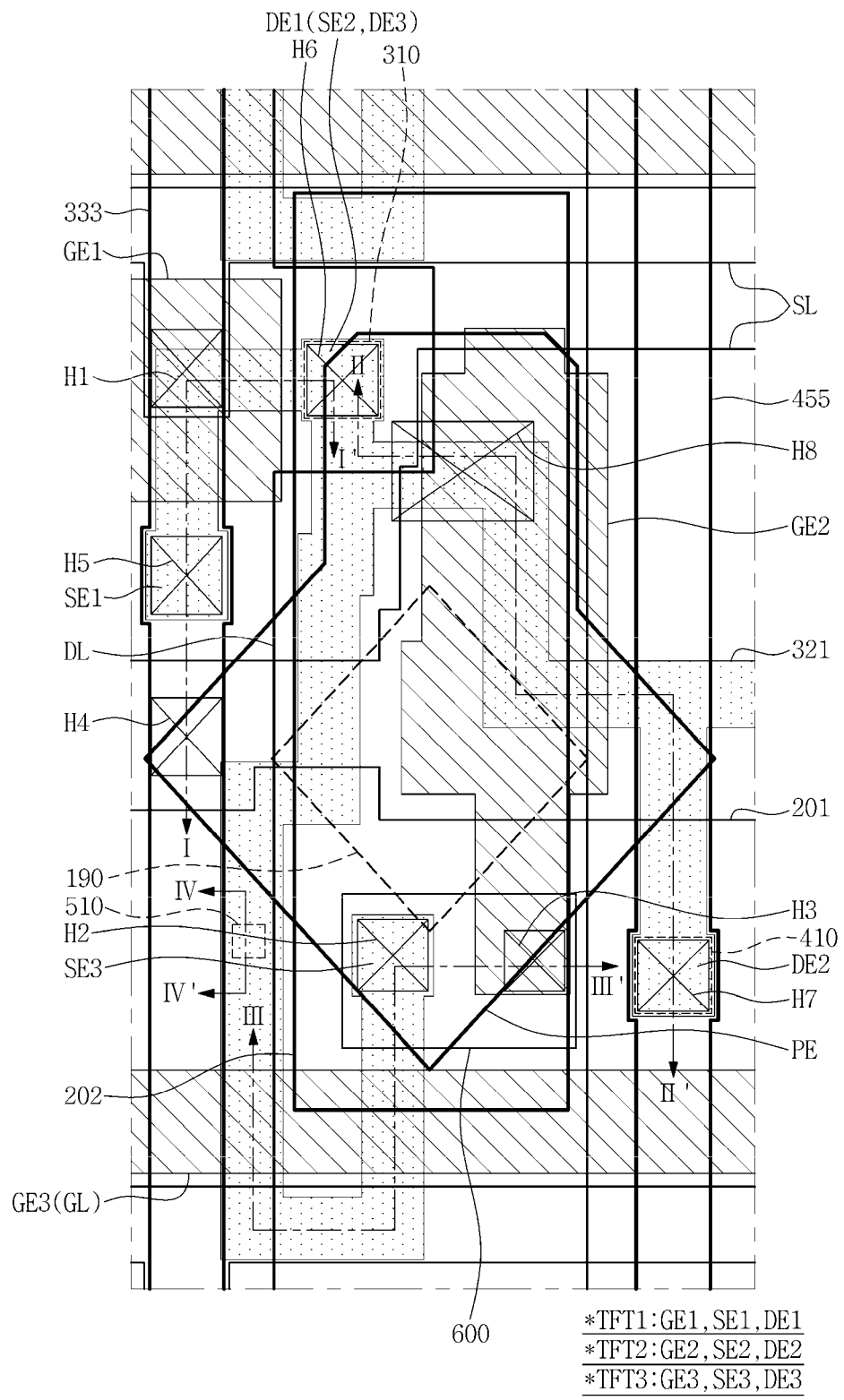
FIG. 2 is a plan view illustrating an exemplary embodiment a display device including a pixel having a structure corresponding to the pixel circuit of FIG. 1.
Figure 3A:
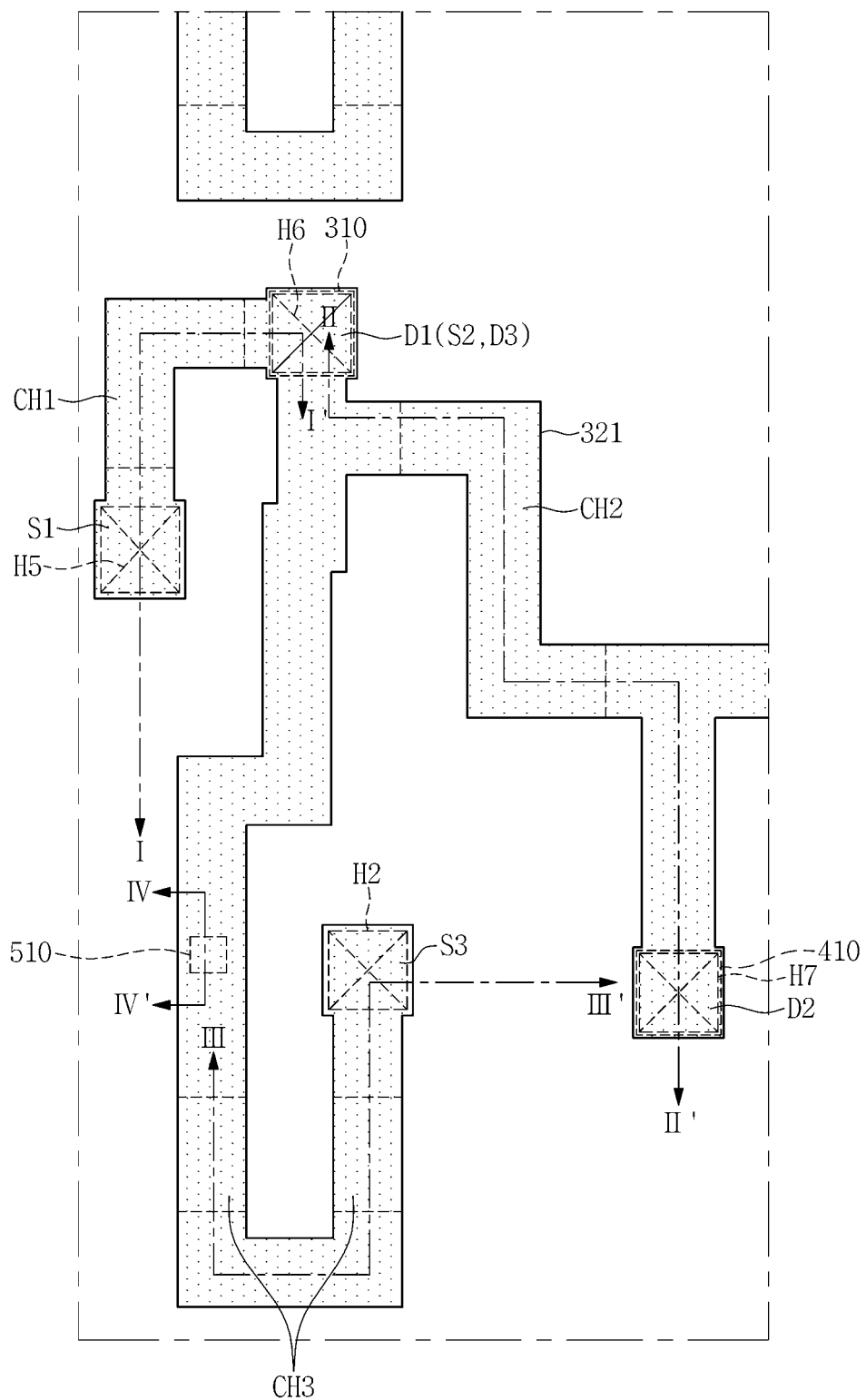
FIGS. 3A, 3B, 3C, 3D, 3E, and 3F are views separately illustrating main configurations of FIG. 2.
Figure 3B:
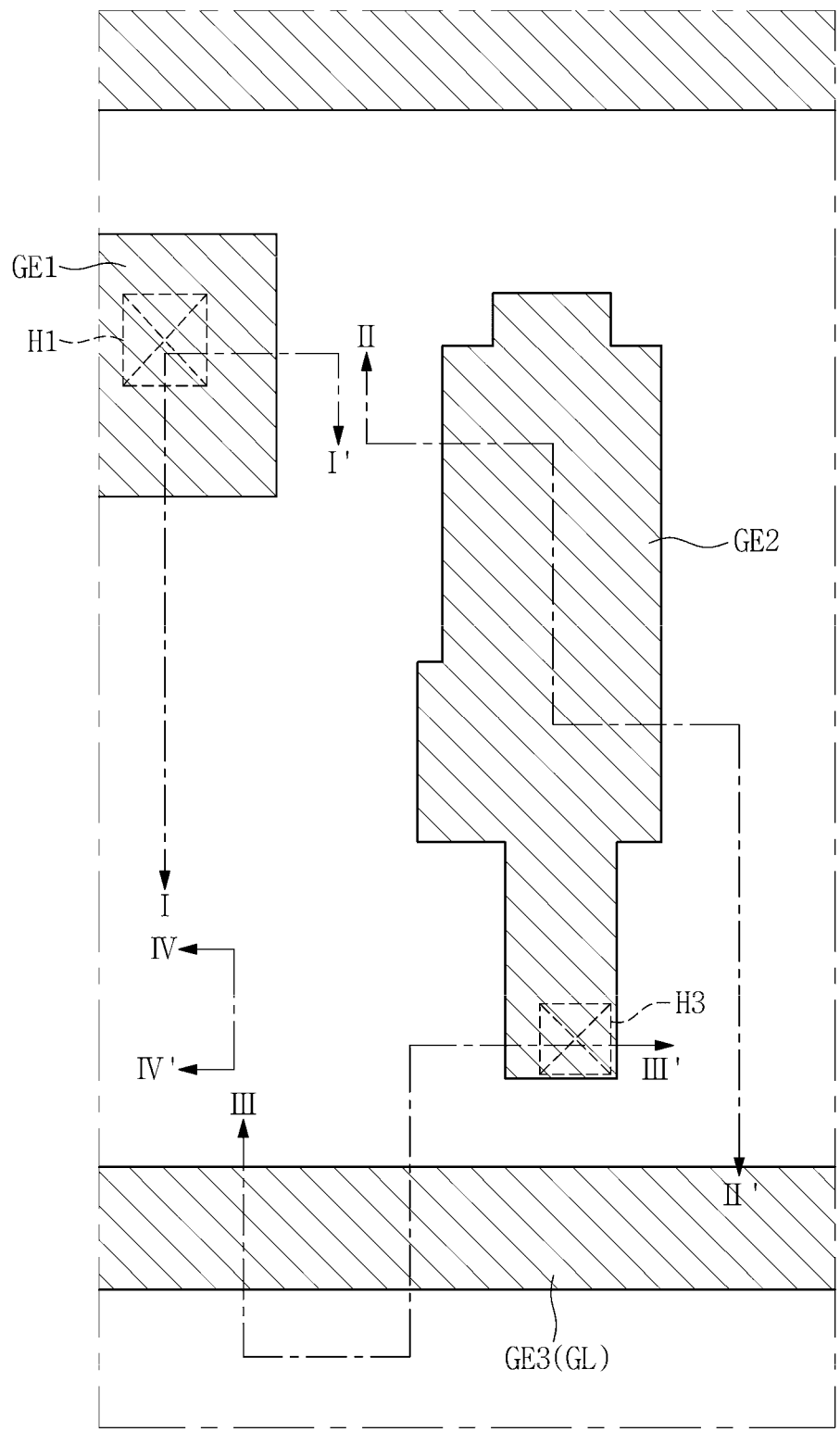
Figure 3C:
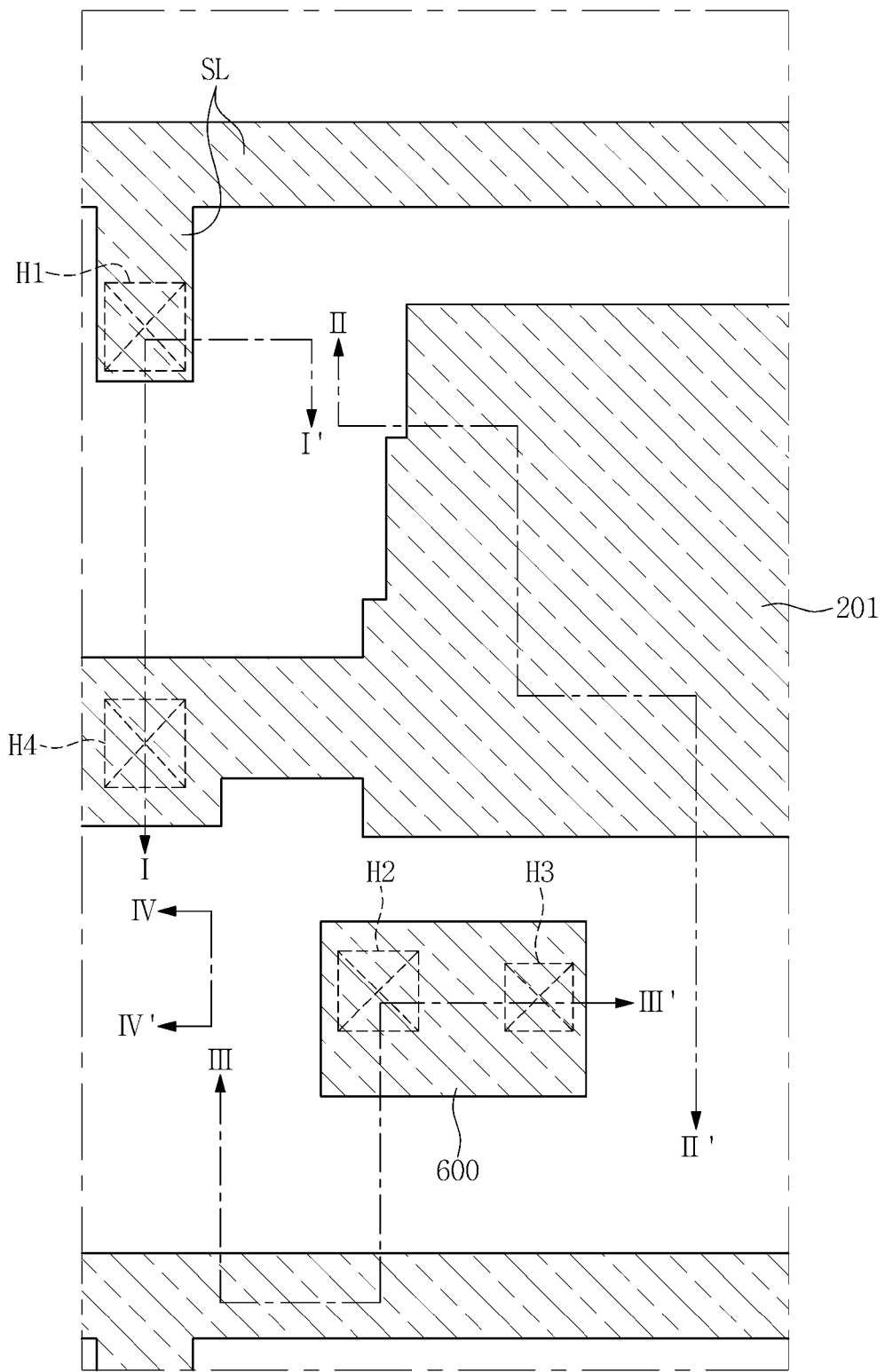
Figure 3D:
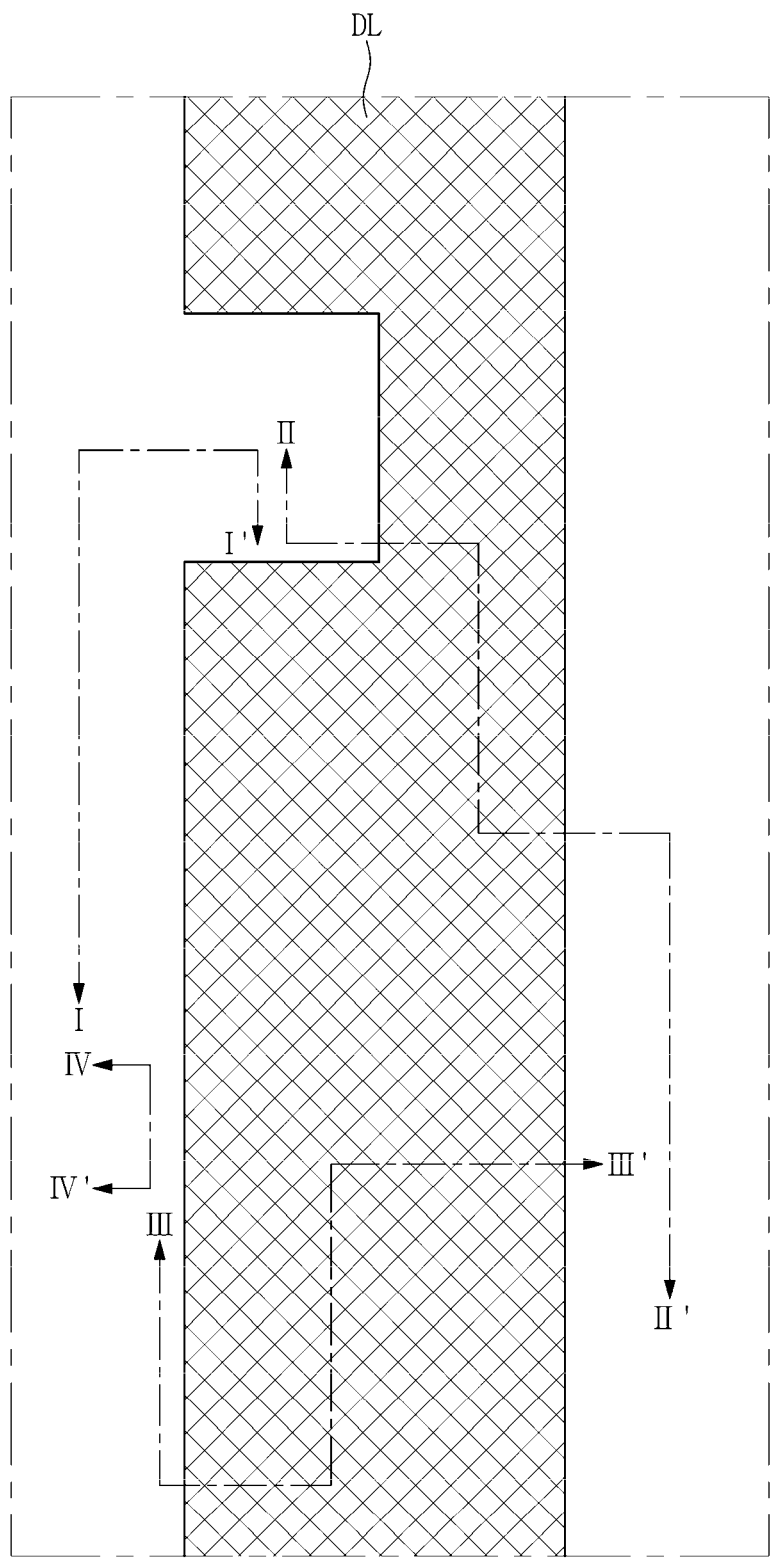
Figure 3E:
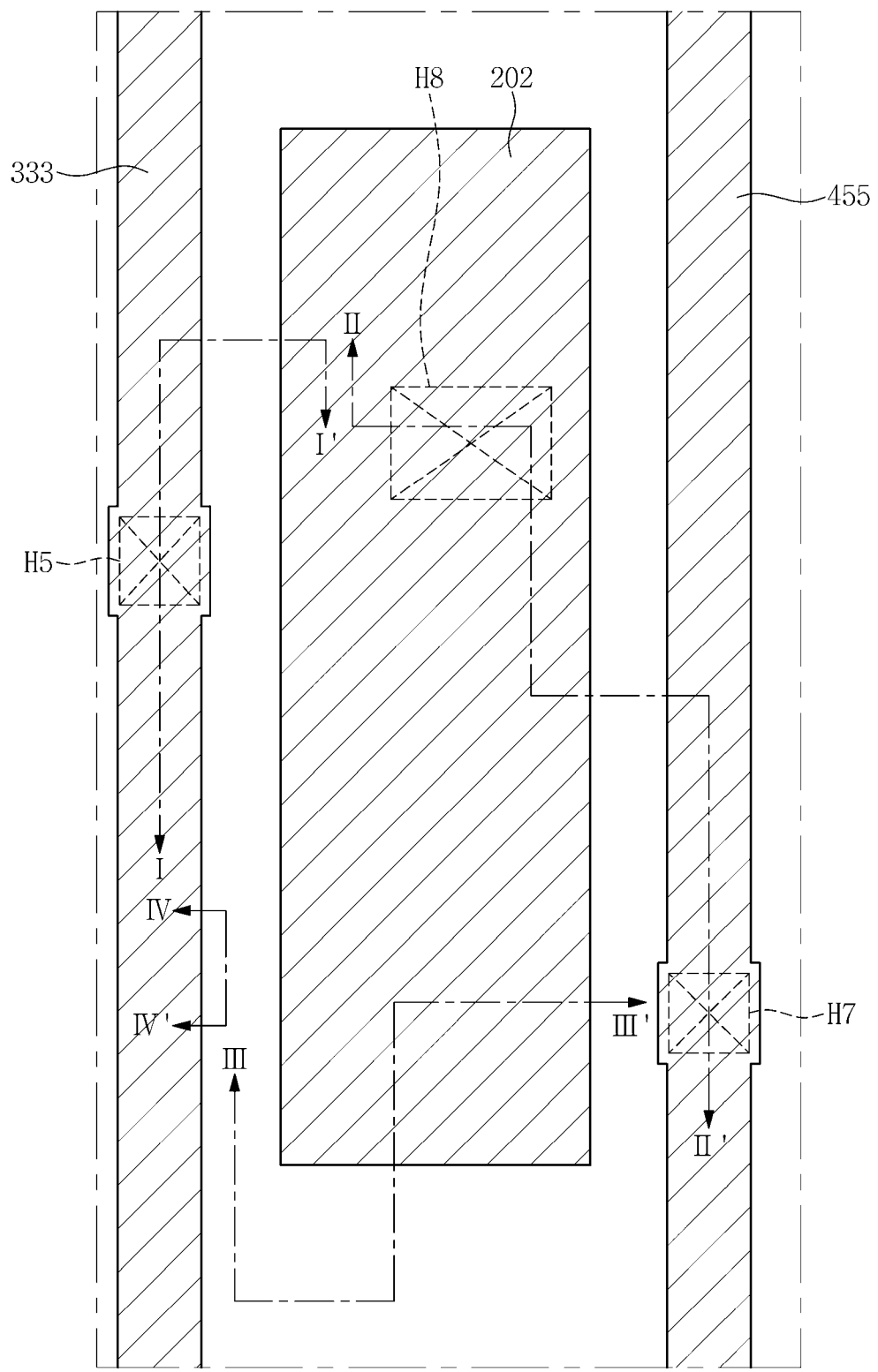
Figure 3F:
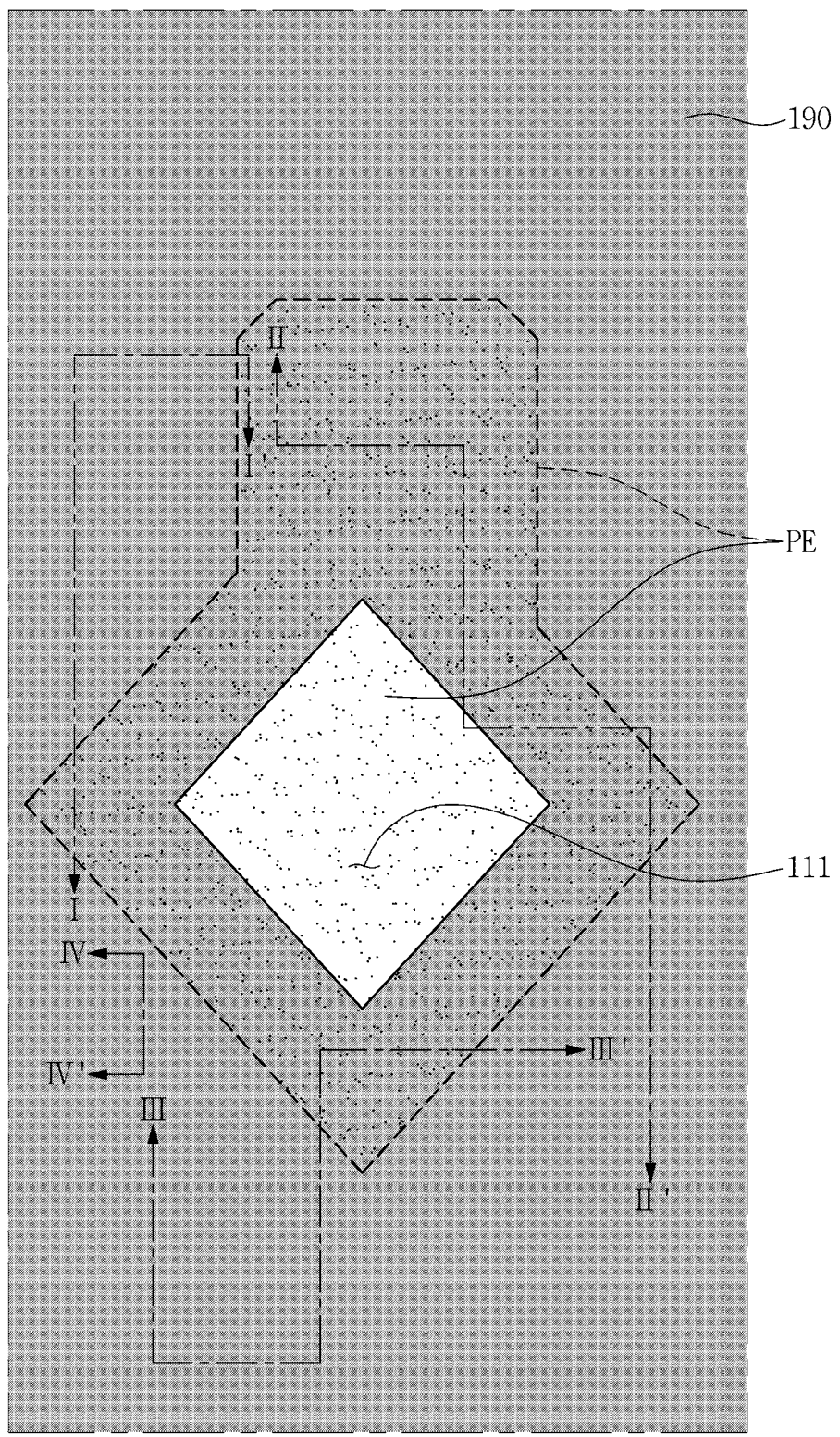
Figure 4:
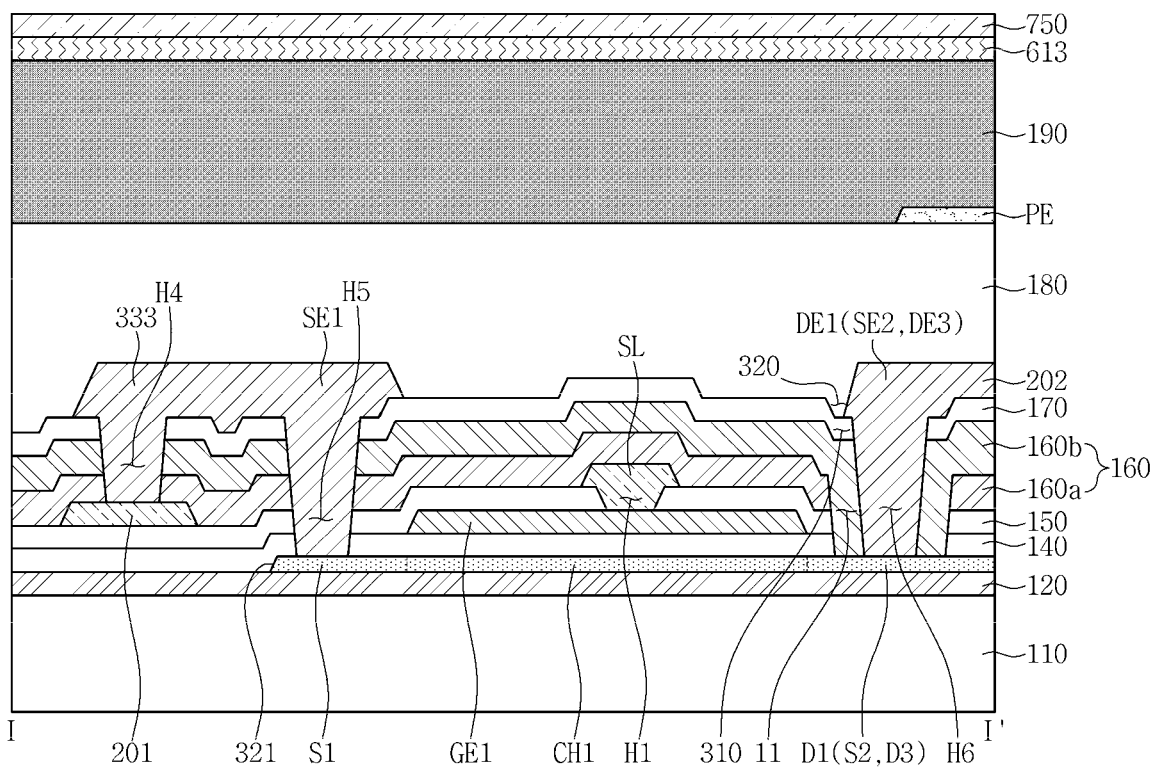
FIG. 4 is a cross-sectional view taken along line I-I' of FIG. 2.
Figure 5:
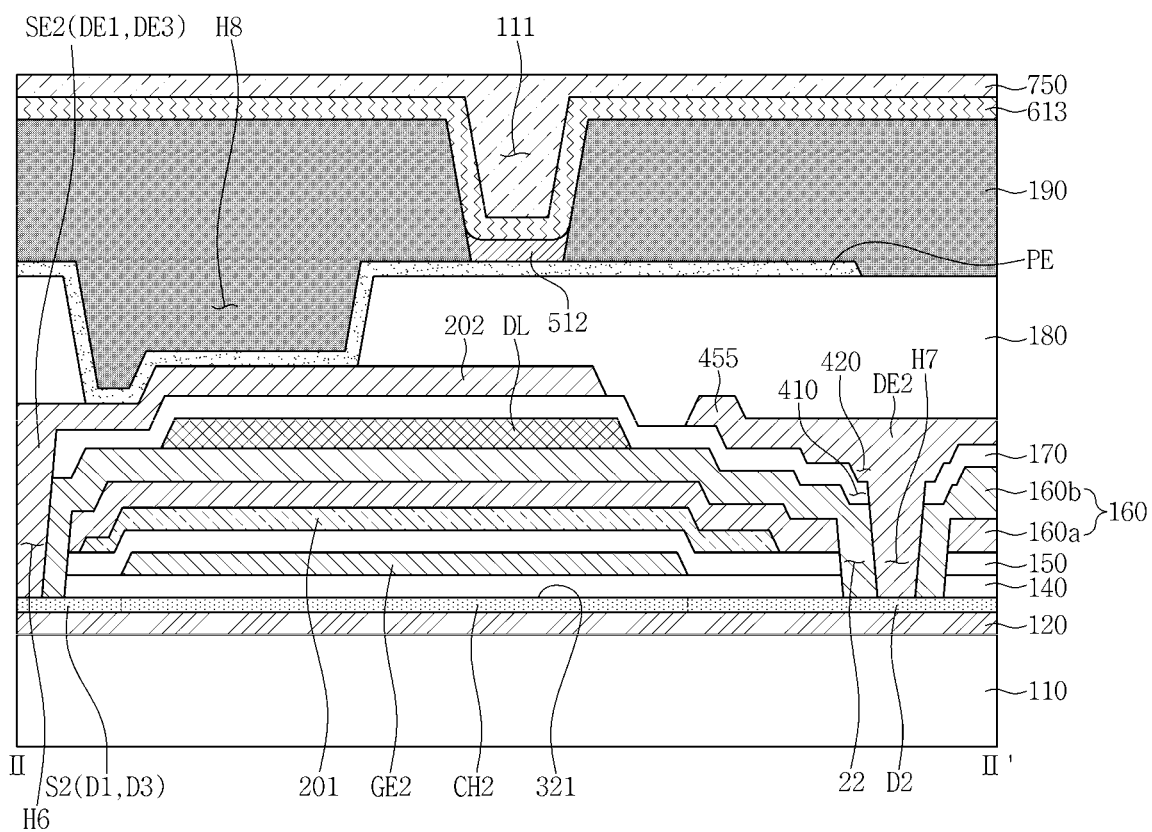
FIG. 5 is a cross-sectional view taken along line II-IP of FIG. 2.
Figure 6:
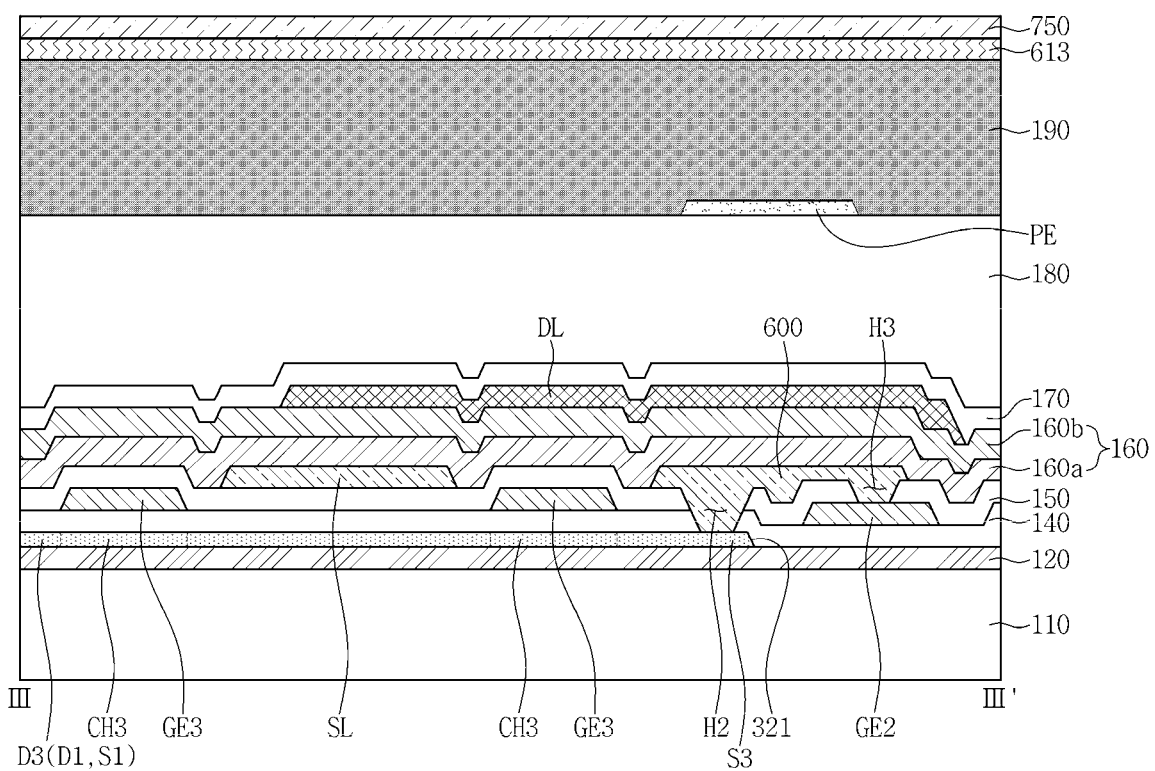
FIG. 6 is a cross-sectional view taken along line of FIG. 2.

FIG. 2 is a plan view illustrating an exemplary embodiment a display device including a pixel having a structure corresponding to the pixel circuit of FIG. 1, FIGS. 3A, 3B, 3C, 3D, 3E, and 3F are views separately illustrating main configurations of FIG. 2, FIG. 4 is a cross-sectional view taken along line I-I' of FIG. 2, FIG. 5 is a cross-sectional view taken along line II-II' of FIG. 2, and FIG. 6 is a cross-sectional view taken along line of FIG. 2.

As illustrated in FIGS. 2, 3, 4, 5, and 6, an exemplary embodiment of a display device includes a substrate 110, a buffer layer 120, a semiconductor layer 321, a gate insulating layer 140, a first gate electrode GE1, a second gate electrode GE2, a third gate electrode GE3, a gate line GL, a first insulating interlayer 150, a first capacitor electrode 201, a scan line SL, a connecting electrode 600, a second insulating interlayer 160, a data line DL, a third insulating interlayer 170, an initiating line 333, a first source electrode SE1, a first drain electrode DE1, a second capacitor electrode 202, a power supply line 455, a second drain electrode DE2, a planarization layer 180, a pixel electrode PE, a pixel defining layer 190, a light emitting layer 512, a common electrode 613, and a sealing member 750.

The first switching element TFT1 includes the first gate electrode GE1, the first source electrode SE1, and the first drain electrode DE1.

The second switching element TFT2 includes the second gate electrode GE2, the second source electrode SE2, and the second drain electrode DE2.

The third switching element TFT3 includes the third gate electrode GE3, the third source electrode SE3, and the third drain electrode DE3.

The first drain electrode DE1 of the first switching element TFT1, the second source electrode SE2 of the second switching element TFT2, and the third drain electrode DE3 of the third switching element TFT3 are connected to one another. For example, the first drain electrode DE1, the second source electrode SE2, and the third drain electrode DE3 may be unitary.

The substrate 110 may be a transparent insulating substrate including glass or transparent plastic. For example, the substrate 110 may include at least one selected from the group consisting of kapton, polyethersulphone (PES), polycarbonate (PC), polyimide (PI), polyethyleneterephthalate (PET), polyethylenenaphthalate (PEN), polyacrylate (PAR), and fiber reinforced plastic (FRP).

The buffer layer 120 is disposed on the substrate 110. The buffer layer 120 may be disposed over an entire surface of the substrate 110. The buffer layer 120 may prevent diffusion of undesirable elements and planarize a surface of the substrate 110, and may include suitable materials for planarizing and/or preventing diffusion. For example, the buffer layer 120 may include one of the followings: a silicon nitride ($SiN_x$) layer, a silicon oxide ($SiO_2$) layer, and a silicon oxynitride ($SiO_xN_y$) layer. However, the buffer layer 120 is not essential and may be omitted based on kinds of the substrate 110 and process conditions thereof.

The semiconductor layer 321 is disposed on the buffer layer 120. As illustrated in FIG. 3A, the semiconductor layer 321 includes a first channel area CH1, a second channel area CH2, a third channel area CH3, a first source area S1, a first drain area D1, a second source area S2, a second drain area D2, a third source area S3, and a third drain area D3.

The semiconductor layer 321 provides the respective channel areas CH1, CH2, and CH3 of the first, second, and third switching elements TFT1, TFT2, and TFT3. In addition, the semiconductor layer 321 provides the respective source areas S1, S2, and S3 of the first, second, and third switching elements TFT1, TFT2, and TFT3. In addition, the semiconductor layer 321 provides the respective drain areas D1, D2, and D3 of the first, second, and third switching elements TFT1, TFT2, and TFT3. The first drain area D1, the second source area S2, and the third drain area D3 of the semiconductor layer 321 are connected to one another. For example, the first drain area D1, the second source area S2, and the third drain area D3 may be unitary.

The semiconductor layer 321 may include one of oxide semiconductors, e.g., a polycrystalline silicon layer, an amorphous silicon layer, indium gallium zinc oxide (IGZO), and indium zinc tin oxide (IZTO). For example, in a case where the semiconductor layer 321 includes a polycrystalline silicon layer, the semiconductor layer 321 includes a channel area that is not doped with impurities and a source area and a drain area that are formed on opposite sides of the channel area and doped with impurity ions.

The gate insulating layer 140 is disposed on the semiconductor layer 321 and the buffer layer 120. The gate insulating layer 140 may include or be formed of at least one of tetraethylorthosilicate (TEOS), silicon nitride ($SiN_x$), or silicon oxide ($SiO_2$), for example. For example, the gate insulating layer 140 may have a double-layer structure in which a $SiN_x$ layer having a thickness of 40 nm and a TEOS layer having a thickness of 80 nm are sequentially stacked.

As illustrated in FIGS. 4, 5, and 6, the first gate electrode GE1, the second gate electrode GE2, the third gate electrode GE3, and the gate line GL (refer to FIG. 3B) are disposed on the gate insulating layer 140.

The first gate electrode GE1 overlaps the first channel area CH1 of the semiconductor layer 321, the second gate electrode GE2 overlaps the second channel area CH2 of the semiconductor layer 321, and the third gate electrode GE3 overlaps the third channel area CH3 of the semiconductor layer 321.

The third gate electrode GE3 is connected to the gate line GL, and as illustrated in FIG. 3B, the third gate electrode GE3 may be a portion of the gate line GL. For example, a portion of the gate line GL overlapping the semiconductor layer 321 may correspond to the third gate electrode GE3.

The gate line GL may include or be formed of aluminum (Al) or alloys thereof, silver (Ag) or alloys thereof, copper (Cu) or alloys thereof, and/or molybdenum (Mo) or alloys thereof. In an exemplary embodiment, the gate line GL may include or be formed of one of chromium (Cr), tantalum (Ta), and titanium (Ti). In an exemplary embodiment, the gate line GL may have a multilayer structure including at least two conductive layers having different physical properties from one another.

The first gate electrode GE1, the second gate electrode GE2, and the third gate electrode GE3 may include substantially a same material and may have substantially a same structure (e.g., a multilayer structure) as those of the gate line GL. Each of the first, second and third gate electrodes GE1, GE2 and GE3 and the gate line GL may be simultaneously provided in substantially a same process.

As illustrated in FIGS. 4, 5, and 6, the first insulating interlayer 150 is disposed on the first gate electrode GE1, the second gate electrode GE2, the third gate electrode GE3 (GE3a and GE3b), and the gate insulating layer 140.

As illustrated in FIGS. 4, 5, and 6, the first capacitor electrode 201, the scan line SL, and the connecting electrode 600 are disposed on the first insulating interlayer 150.

The first capacitor electrode 201 overlaps the second gate electrode GE2, and the scan line SL overlaps the semiconductor layer 321. The first capacitor Cst is disposed between the first capacitor electrode 201 and the second gate electrode GE2. The second gate electrode GE2 corresponds to one terminal of the first capacitor Cst, and the first capacitor electrode 201 corresponds to another terminal of the first capacitor Cst.

The scan line SL is connected to the first gate electrode GE1 through a first contact hole H1. The first contact hole H1 overlaps the first gate electrode GE1. The first contact hole H1 passes through the first insulating interlayer 150 to expose a portion of the first gate electrode GE1.

A portion of the connecting electrode 600 is connected to the third source area S3 of the semiconductor layer 321 through a second contact hole H2, and another portion of the connecting electrode 600 is connected to the second gate electrode GE2 through a third contact hole H3. The third source area S3 and the second gate electrode GE2 are connected to each other by the connecting electrode 600.

The second contact hole H2 overlaps the third source area S3 of the semiconductor layer 321. The second contact hole H2 passes through the first insulating interlayer 150 and the gate insulating layer 140 to expose a portion of the third source area S3.

The third contact hole H3 overlaps the second gate electrode GE2. The third contact hole H3 passes through the first insulating interlayer 150 to expose a portion of the second gate electrode GE2.

The second insulating interlayer 160 is disposed on the first capacitor electrode 201, the scan line SL, the connecting electrode 600, and the first insulating interlayer 150. The second insulating interlayer 160 includes a first insulating layer 160a and a second insulating layer 160b. The first insulating layer 160a is disposed on the first capacitor electrode 201, the scan line SL, the connecting electrode 600, and the first insulating interlayer 150. The second insulating layer 160b is disposed on the first insulating layer 160a.

As illustrated in FIGS. 5 and 6, the data line DL is disposed on the second insulating interlayer 160. For example, the data line DL is disposed on the second insulating layer 160b of the second insulating interlayer 160. The data line DL externally receives an image data signal.

The data line DL may include or be formed of a refractory metal, such as molybdenum, chromium, tantalum and titanium, or an alloy thereof. The data line DL may have a multilayer structure including a refractory metal layer and a low-resistance conductive layer. Examples of the multilayer structure may include: a double-layer structure including a chromium or molybdenum (alloy) lower layer and an aluminum (alloy) upper layer; and a triple-layer structure including a molybdenum (alloy) lower layer, an aluminum (alloy) intermediate layer, and a molybdenum (alloy) upper layer. In an alternative exemplary embodiment, the data line DL may include or be formed of any suitable metals or conductors rather than the aforementioned materials.

The third insulating interlayer 170 is disposed on the data line DL and the second insulating interlayer 160.

As illustrated in FIGS. 4 and 5, the initiating line 333, the first source electrode SE1, the first drain electrode DE1, the second capacitor electrode 202, the power supply line 455, and the second drain electrode DE2 are disposed on the third insulating interlayer 170. The first drain electrode DE1, the second source electrode SE2, and the third drain electrode DE3 may be unitary.

The initiating line 333 is connected to the first capacitor electrode 201 through a fourth contact hole H4. The fourth contact hole H4 overlaps the first capacitor electrode 201. The fourth contact hole H4 passes through the third insulating interlayer 170 and the second insulating interlayer 160 to expose a portion of the first capacitor electrode 201.

The first source electrode SE1 is connected to the first source area S1 of the semiconductor layer 321 through a fifth contact hole H5. The initiating line 333 and the first source electrode SE1 are connected to each other. For example, as illustrated in FIG. 4, the initiating line 333 and the first source electrode SE1 may be unitary. The fifth contact hole H5 overlaps the first source area S1 of the semiconductor layer 321. The fifth contact hole H5 passes through the third insulating interlayer 170, the second insulating interlayer 160, the first insulating interlayer 150, and the gate insulating layer 140 to expose a portion of the first source area S1.

The first drain electrode DE1 is connected to the first drain area D1 of the semiconductor layer 321 through a sixth contact hole H6. The sixth contact hole H6 overlaps the first drain area D1 of the semiconductor layer 321. The sixth contact hole H6 passes through the third insulating interlayer 170, the second insulating interlayer 160, the first insulating interlayer 150, and the gate insulating layer 140 to expose a portion of the first drain area D1.

The second drain electrode DE2 is connected to the second drain area D2 of the semiconductor layer 321 through a seventh contact hole H7. The seventh contact hole H7 overlaps the second drain area D2 of the semiconductor layer 321. The seventh contact hole H7 passes through the third insulating interlayer 170, the second insulating interlayer 160, the first insulating interlayer 150, and the gate insulating layer 140 to expose a portion of the second drain area D2.

As illustrated in FIG. 5, the second capacitor electrode 202 overlaps the data line DL. The second capacitor Cpr is disposed between the capacitor electrode 202 and the data line DL. The second capacitor electrode 202 corresponds to one terminal of the second capacitor Cpr and the data line DL corresponds to another terminal of the second capacitor Cpr.

As illustrated in FIGS. 4 and 5, the planarization layer 180 is disposed on the initiating line 333, the first source electrode SE1, the first drain electrode DE1, the second capacitor electrode 202, the power supply line 455, the second drain electrode DE2, and the third insulating interlayer 170.

The planarization layer 180 may significantly reduce (e.g., eliminate) a step difference of the substrate 110, thus planarizing the substrate 110, so as to increase luminance efficiency of an LED (e.g., OLED) to be formed thereon. The planarization layer 180 may include at least one of the following materials: a polyacrylate resin, an epoxy resin, a phenolic resin, a polyamide resin, a polyimide resin, an unsaturated polyester resin, a polyphenylen-based resin (e.g., a polyphenylen ether resin), a polyphenylene sulfide resin, and benzocyclobutene (BCB).

The pixel electrode PE is disposed on the planarization layer 180. A portion of the pixel electrode PE or the entirety of the pixel electrode PE is disposed on a pixel area 111. That is, the pixel electrode PE is disposed corresponding to the pixel area 111 which is defined by the pixel defining layer 190 to be described hereinbelow. The pixel defining layer 190 may include a resin, e.g., a polyacrylate resin and a polyimide resin.

The pixel electrode PE is connected to the second capacitor electrode 202 through an eighth contact hole H8. The eighth contact hole H8 overlaps the planarization layer 180. The eighth contact hole H8 passes through the planarization layer 180 to expose a portion of the second capacitor electrode 202.

The light emitting layer 512 is disposed on the pixel electrode PE in the pixel area 111, and the common electrode 613 is disposed on the pixel defining layer 190 and the light emitting layer 512.

The light emitting layer 512 includes a low-molecular weight organic material or a high-molecular weight organic material. Although not illustrated, at least one of a hole injection layer HIL and a hole transport layer HTL may further be disposed between the pixel electrode PE and the light emitting layer 512, and at least one of an electron transport layer ETL and an electron injection layer EIL may further be disposed between the light emitting layer 512 and the common electrode 613.

The pixel electrode PE and the common electrode 613 may be formed as one of the followings: a transmissive electrode, a transflective electrode, and a reflective electrode.

The transmissive electrode may include transparent conductive oxide ("TCO"). The TCO may include at least one selected from the group consisting of: indium tin oxide (ITO), indium zinc oxide (IZO), antimony tin oxide (ATO), aluminum zinc oxide (AZO), zinc oxide (ZnO), and alloys thereof.

The transflective electrode and the reflective electrode may use a metal, e.g., magnesium (Mg), silver (Ag), gold (Au), calcium (Ca), lithium (Li), chromium (Cr), aluminum (Al), and copper (Cu), or an alloy thereof. In such an exemplary embodiment, whether an electrode is a transflective type or a reflective type depends on a thickness of the electrode. Typically, the transflective electrode has a thickness of about 200 nm or less and the reflective electrode has a thickness of about 300 nm or more. As the thickness of the transflective electrode decreases, light transmittance and resistance increases. On the contrary, as the thickness of the transflective electrode increases, light transmittance decreases.

In addition, the transflective electrode and the reflective electrode may have a multilayer structure which includes a metal layer including a metal or a metal alloy and a TCO layer stacked on the metal layer.

The sealing member 750 is disposed on the common electrode 613. The sealing member 750 may use a transparent insulating substrate including glass and/or transparent plastic. In addition, the sealing member 750 may have a thin film encapsulation structure in which one or more inorganic layers and one or more organic layers are alternately stacked.

Although not illustrated, water-resistance coating layers may further be disposed on the sealing member 750. The water-resistance coating layers may include a polymer-based material that is transparent. For example, the water-resistance coating layers may use polyester and parylene. The water-resistance coating layers may be coated in a thermal diffusion deposition method at a room temperature or may be attached on the sealing member 750 as a film form. In addition, any suitable water-resistance coating layer typically used in the pertinent art may be applied to the present inventive concept.

Figure 7A:
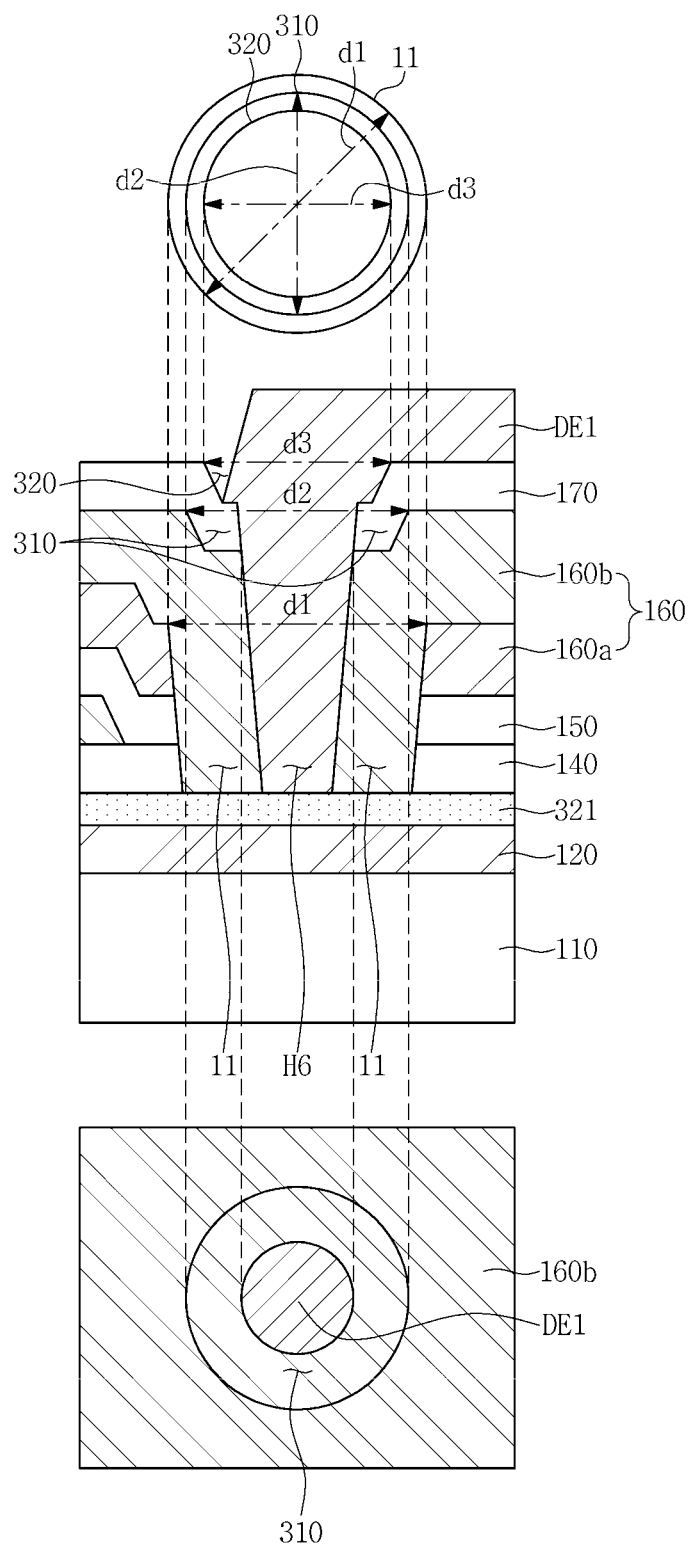
FIG. 7A is an enlarged view illustrating an example of a first dummy hole and the vicinity of the first dummy hole of FIG. 4.

FIG. 7A is an enlarged view illustrating an example of a first dummy hole and the vicinity of the first dummy hole of FIG. 4. An intermediate view of FIG. 7A is an enlarged view of FIG. 4, an upper view of FIG. 7A is a plan view illustrating size of a hole and each groove, and a lower view of FIG. 7A is a plan view illustrating a shape of a first hole.

As illustrated in FIG. 7A, due to a first dummy hole 11, the second insulating layer 160b and the third insulating interlayer 170 above the first dummy hole 11 may have grooves 310 and 320, respectively, each grooves 310 and 320 may have a concave portion over the first dummy hole 11. For ease of description, the groove of the second insulating layer 160b is defined as a first groove 310 and the groove of the third insulating interlayer 170 is defined as a second groove 320.

The first groove 310 overlaps the first dummy hole 11 and the semiconductor layer 321.

The second groove 320 overlaps the first dummy hole 11, the semiconductor layer 321, and the first groove 310.

Each of the first groove 310 and the second groove 320 has a closed-loop shape in a plan view. In other words, each of the first groove 310 and the second groove 320 has a closed-loop shape surrounding an electrode (e.g., the first drain electrode DE1) that is inserted through a contact hole (e.g., the contact hole H6).

For example, as illustrated in the lower view of FIG. 7A, in a plane view, the first groove 310 may have a ring shape surrounding a contact portion of the first drain electrode DE1. Accordingly, a portion of the third insulating interlayer 170 in the first groove 310 may have a ring shape surrounding the contact portion of the first drain electrode DE1. In other words, a portion of the third insulating interlayer 170 may be disposed between an inner wall of the first groove 310 and the first drain electrode DE1 in a cross-sectional view.

The second groove 320 may have a ring shape surrounding the contact portion of the first drain electrode DE1 in a plan view. Accordingly, a portion of the planarization layer 180 in the second groove 320 may have a ring shape surrounding the contact portion of the first drain electrode DE1. In other words, a portion of the planarization layer 180 may be disposed between an inner wall of the second groove 320 and the first drain electrode DE1 in a cross-sectional view.

A size of the first groove 310 is less than a size of the first dummy hole 11. For example, a diameter d2 of the first groove 310 is less than a diameter d1 of the first dummy hole 11.

A size of the second groove 320 is less than the size of the first groove 310. For example, a diameter d3 of the second groove 320 is less than the diameter d2 of the first groove 310.

As illustrated in the upper view of FIG. 7A, from a plane, the first dummy hole 11 surrounds the first groove 310, and the first groove 310 surrounds the second groove 320. The first dummy hole 11 surrounds the first and second grooves 310 and 320.

The first dummy hole 11 may have a ring shape surrounding the contact portion of the first drain electrode DE in the sixth contact hole H6.

Figure 7B:
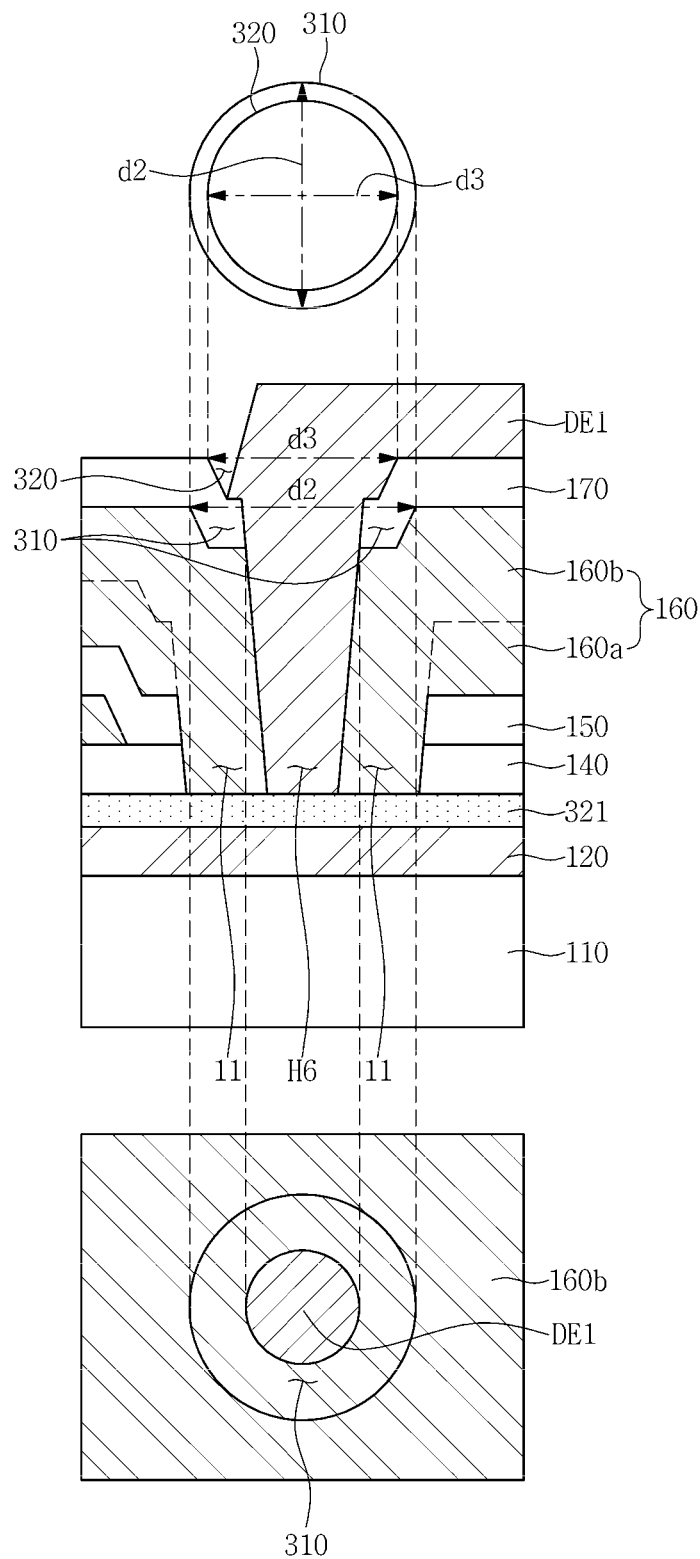
FIG. 7B is an enlarged view illustrating another example of the first dummy hole and the vicinity of the first dummy hole of FIG. 4.

FIG. 7B is an enlarged view illustrating another example of the first dummy hole and the vicinity of the first dummy hole of FIG. 4. An intermediate view of FIG. 7B is an enlarged view of FIG. 4, an upper view of FIG. 7B is a plan view illustrating size of a hole and each groove, and a lower view of FIG. 7B is a plan view illustrating a shape of a first hole.

As illustrated in FIG. 7B, the first insulating layer 160a and the second insulating layer 160b may include substantially a same material. Accordingly, although the first insulating layer 160a and the second insulating layer 160b are sequentially formed, after forming the second insulating layer 160b, an interface between the first insulating layer 160a and the second insulating layer 160b is not visible. That is, the first insulating layer 160a and the second insulating layer 160b may be provided as a single second insulating interlayer 160.

In such an exemplary embodiment, due to the first dummy hole 11, the second insulating layer 160b and the third insulating interlayer 170 may have grooves 310 and 320, respectively, each grooves 310 and 320 may have a concave portion over the first dummy hole 11.

The first groove 310 and the second groove 320 illustrated in FIG. 7B are substantially the same as the first groove 310 and the second groove 320 illustrated in FIG. 7A, and thus detailed descriptions pertaining thereto will make reference to FIG. 7A and related descriptions.

The first dummy hole 11 illustrated in FIG. 7B is a hole passing through the first insulating interlayer 150 and the gate insulating layer 140.

In an exemplary embodiment, in a case where an insulating layer is not further provided between the first insulating layer 160a and the semiconductor layer 321, and the first insulating layer 160a and the second insulating layer 160b include substantially a same material as described hereinabove, the first dummy hole 11 may not substantially visually recognized after the second insulating layer 160b is formed. However, although visually not recognized, the first dummy hole 11 exists below the first insulating layer 160a and the second insulating layer 160b. Accordingly, in such an exemplary embodiment, due to the first dummy hole 11, the second insulating layer 160b and the third insulating interlayer 170 may have grooves 310 and 320, respectively, each of the grooves 310 and 320 may have a concave portion over the first dummy hole 11.

The second insulating layer 160b and the third insulating interlayer 170 overlapping a second dummy hole 22 are defined with a first groove 410 and a second groove 420, respectively, and the first groove 410 and the second groove 420 are the same as the first groove 310 and the second groove 320 illustrated in FIGS. 7A and 7B.

Figure 8:
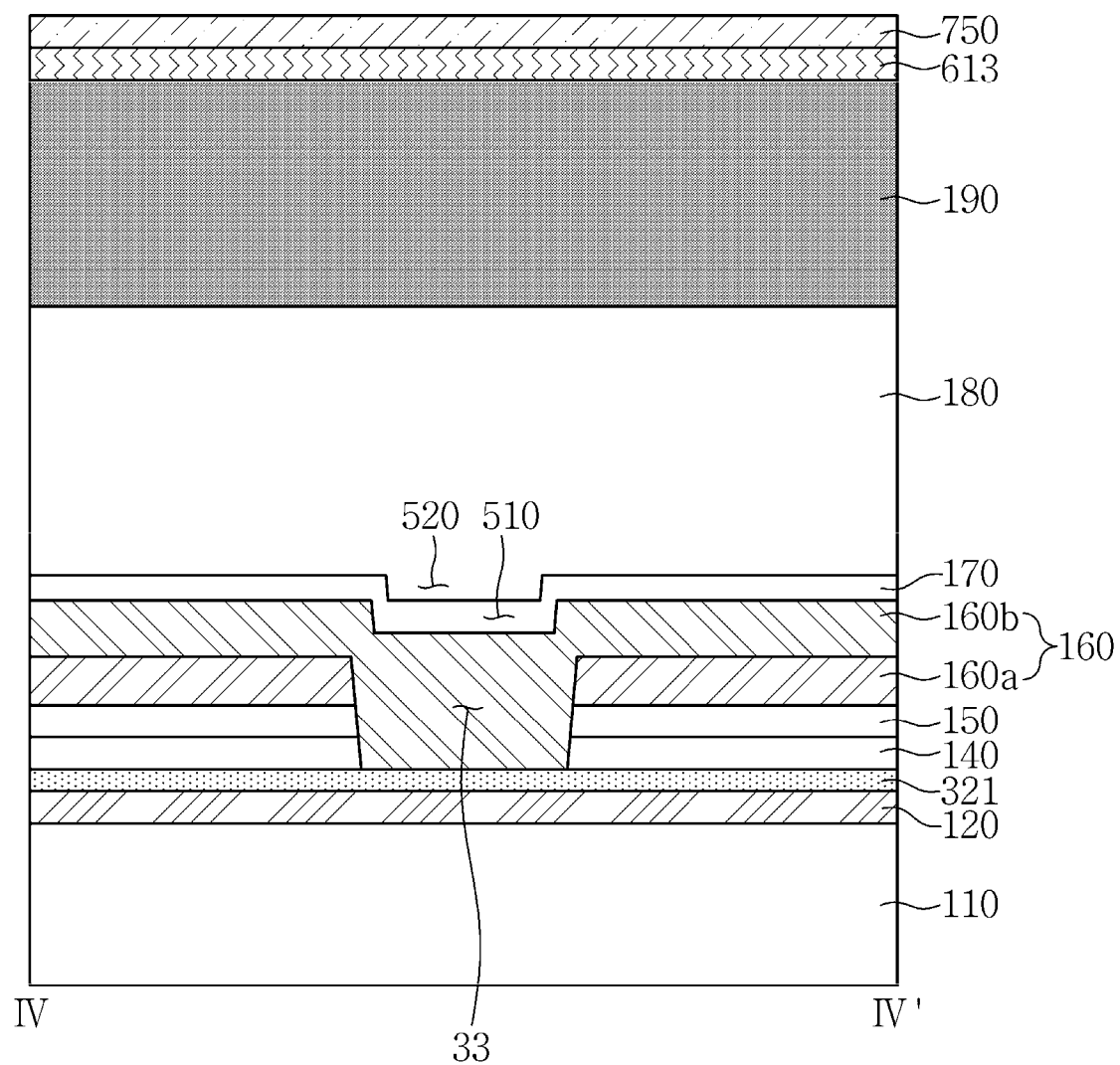
FIG. 8 is a cross-sectional view taken along line IV-IV' of FIG. 2.

FIG. 8 is a cross-sectional view taken along line IV-IV' of FIG. 2.

As illustrated in FIG. 8, a dummy hole (hereinafter, a third dummy hole 33) may be defined in a position different from a position defined with a contact hole. The third dummy hole 33 overlaps the semiconductor layer 321.

In such an exemplary embodiment, due to the third dummy hole 33, the second insulating layer 160b and the third insulating interlayer 170 may have grooves 510 and 520, respectively, each of the grooves 510 and 520 may have concave portion over the third dummy hole 33.

Figure 9A:
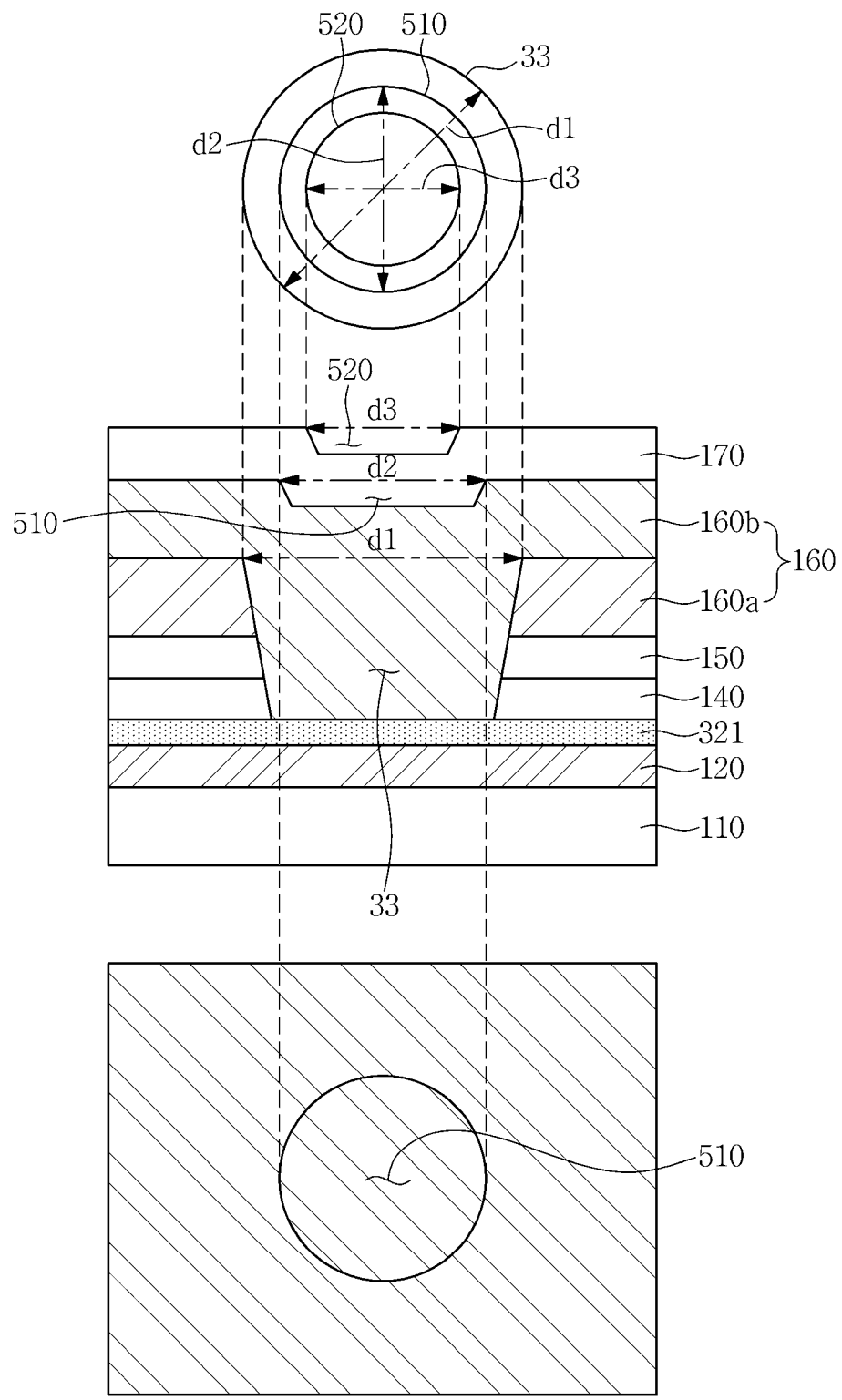
FIG. 9A is an enlarged view illustrating an example of a third dummy hole and the vicinity of the third dummy hole of FIG. 8.

FIG. 9A is an enlarged view illustrating an example of a third dummy hole and the vicinity of the third dummy hole of FIG. 8. An upper view of FIG. 9A is a plan view illustrating size of a hole and each groove, and a lower view of FIG. 9A is an enlarged view of FIG. 8.

As illustrated in FIG. 9A, due to the third dummy hole 33, the second insulating layer 160b and the third insulating interlayer 170 above the third dummy hole 33 may have the grooves 510 and 520, respectively, each of the grooves 510 and 520 may have a concave portion over the third dummy hole 33. For ease of description, the groove 510 of the second insulating layer 160b is defined as the first groove 510 and the groove 520 of the third insulating interlayer 170 is defined as the second groove 520.

The first groove 510 overlaps the third dummy hole 33 and the semiconductor layer 321.

The second groove 520 overlaps the third dummy hole 33, the semiconductor layer 321, and the first groove 510.

Each of the first groove 510 and the second groove 520 has a closed-loop shape in a plan view.

A size of the first groove 510 is less than a size of the third dummy hole 33. For example, a diameter d2 of the first groove 510 is less than a diameter d1 of the third dummy hole 33.

A size of the second groove 520 is less than the size of the first groove 510. For example, a diameter d3 of the second groove 520 is less than the diameter d2 of the first groove 510.

As illustrated in the upper view of FIG. 9A, the third dummy hole 33 surrounds the first groove 510, and the first groove 510 surrounds the second groove 520 in a plan view. The third dummy hole 33 surrounds the first and second grooves 510 and 520 in a plan view.

Figure 9B:
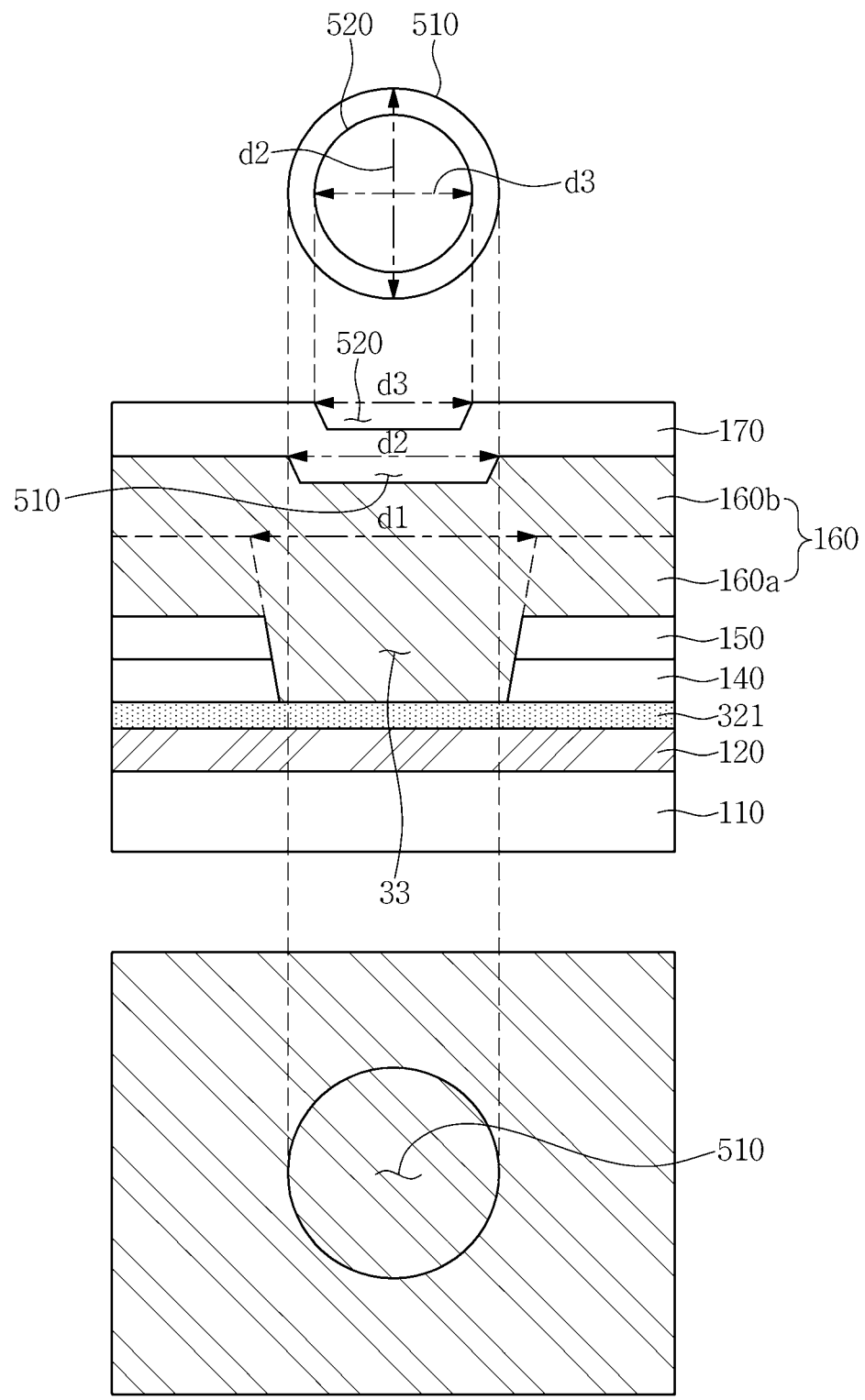
FIG. 9B is an enlarged view illustrating another example of the third dummy hole and the vicinity of the third dummy hole of FIG. 8.

FIG. 9B is an enlarged view illustrating another example of the third dummy hole and the vicinity of the third dummy hole of FIG. 8. An upper view of FIG. 9B is a plan view illustrating size of a hole and each groove, and a lower view of FIG. 9B is an enlarged view of FIG. 8.

As illustrated in FIG. 9B, the first insulating layer 160a and the second insulating layer 160b may include substantially a same material. Accordingly, although the first insulating layer 160a and the second insulating layer 160b are sequentially formed, after forming the second insulating layer 160b, an interface between the first insulating layer 160a and the second insulating layer 160b is not visible. That is, the first insulating layer 160a and the second insulating layer 160b may be provided as a single second insulating interlayer 160.

In such an exemplary embodiment, due to the third dummy hole 33, the second insulating layer 160b and the third insulating interlayer 170 may have grooves 510 and 520, respectively, each of the second insulating layer 160b and the third insulating interlayer 170 may have concave portion over the third dummy hole 33.

FIGS. 10A to 12H are cross-sectional views illustrating processes of manufacturing an exemplary embodiment of a display device. Herein, FIGS. 10A, 10B, 10C, 10D, 10E, 10F, 10G, 10H, 10I, 10J, and 10K are cross-sectional views corresponding to FIG. 4, FIGS. 11A, 11B, 11C, 11D, 11E, 11F, 11G, 11H, 11I, 11J, and 11K are cross-sectional views corresponding to FIG. 5, and FIGS. 12A, 12B, 12C, 12D, 12E, 12F, 12G, and 12H are cross-sectional views corresponding to FIG. 6.

Figure 10A:
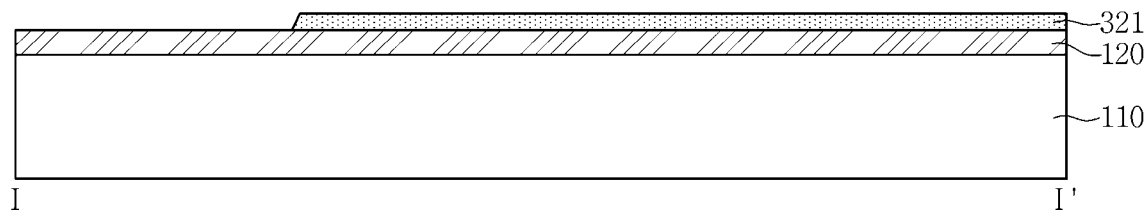
FIGS. 10A, 10B, 10C, 10D, 10E, 10F, 10G, 10H, 10I, 10J, 10K, 11A, 11B, 11C, 11D, 11E, 11F, 11G, 11H, 11I, 11J, 11K, 12A, 12B, 12C, 12D, 12E, 12F, 12G and 12H are cross-sectional views illustrating processes of manufacturing an exemplary embodiment of a display device.
Figure 11A:
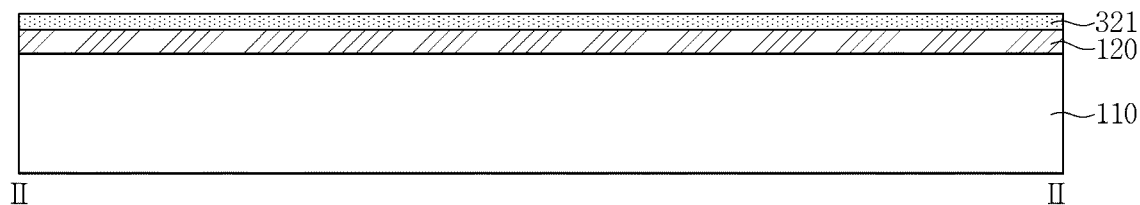
Figure 12A:
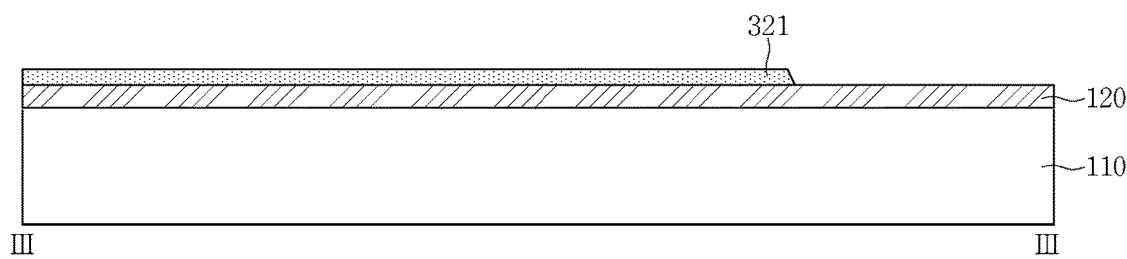

Firstly, as illustrated in FIGS. 10A, 11A, and 12A, the buffer layer 120 is formed over an entire surface of the substrate 110. The buffer layer 120 may be formed by a chemical vapor deposition ("CVD") method.

Subsequently, although not illustrated, a semiconductor material is formed over an entire surface of the substrate 110 including the buffer layer 120. The semiconductor material may be formed by a CVD method.

Subsequently, the semiconductor material is patterned through a photolithography process such that the semiconductor layer 321 is formed as illustrated in FIGS. 10A, 11A, and 12A. The semiconductor material may be removed by a dry etching method using an etching gas.

Figure 10B:
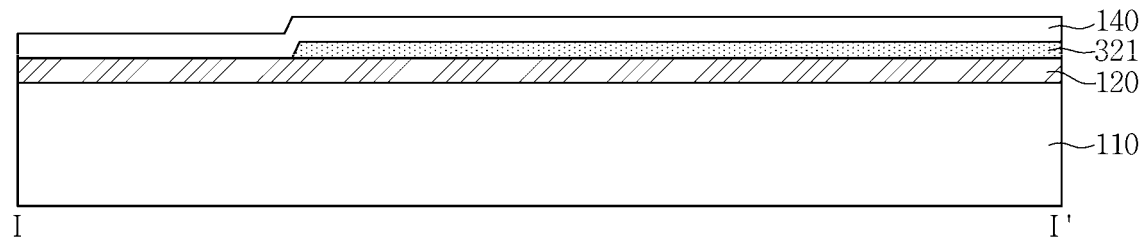
Figure 11B:
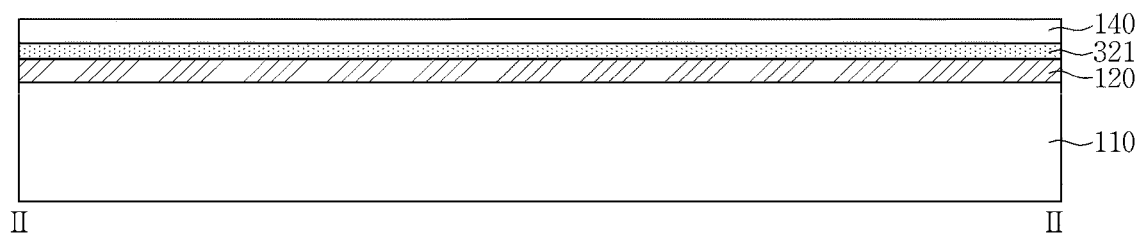
Figure 12B:
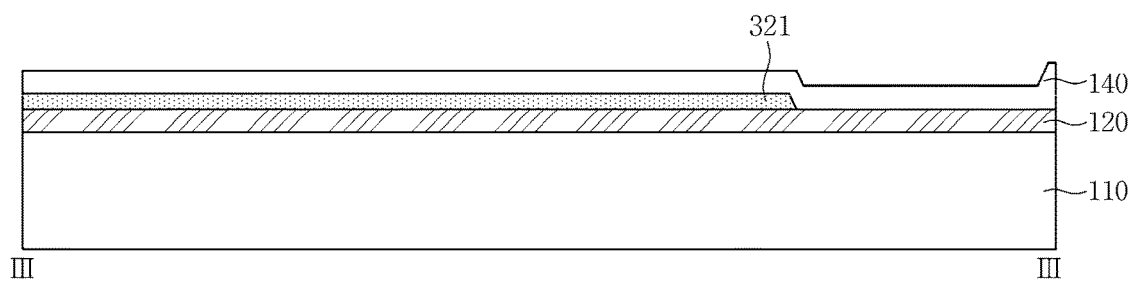

Subsequently, as illustrated in FIGS. 10B, 11B, and 12B, the gate insulating layer 140 is formed over the entire surface of the substrate 110 including the semiconductor layer 321 and the buffer layer 120. The gate insulating layer 140 may be formed by a CVD method.

Subsequently, although not illustrated, a first metal layer is formed over the entire surface of the substrate 110 including the gate insulating layer 140. The first metal layer may be formed by a physical vapor deposition ("PVD") method such as sputtering or evaporating.

Figure 10C:
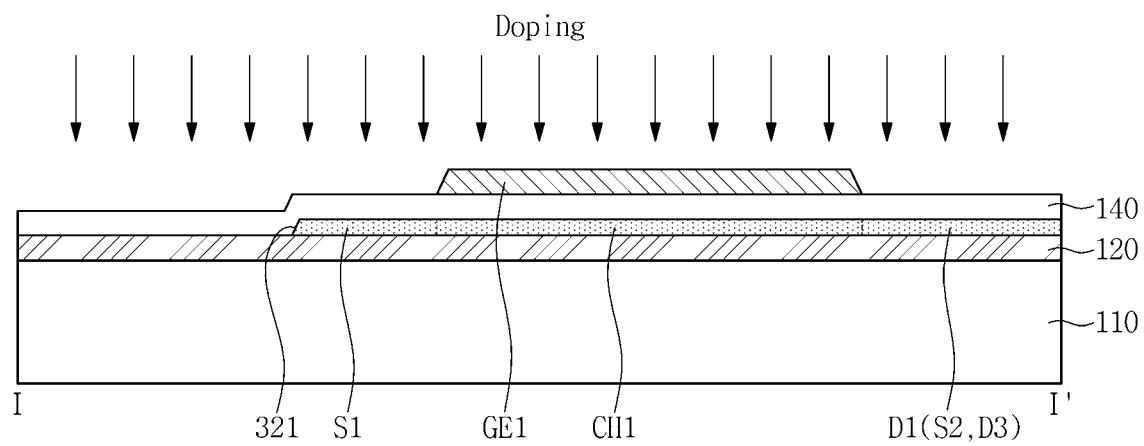
Figure 11C:
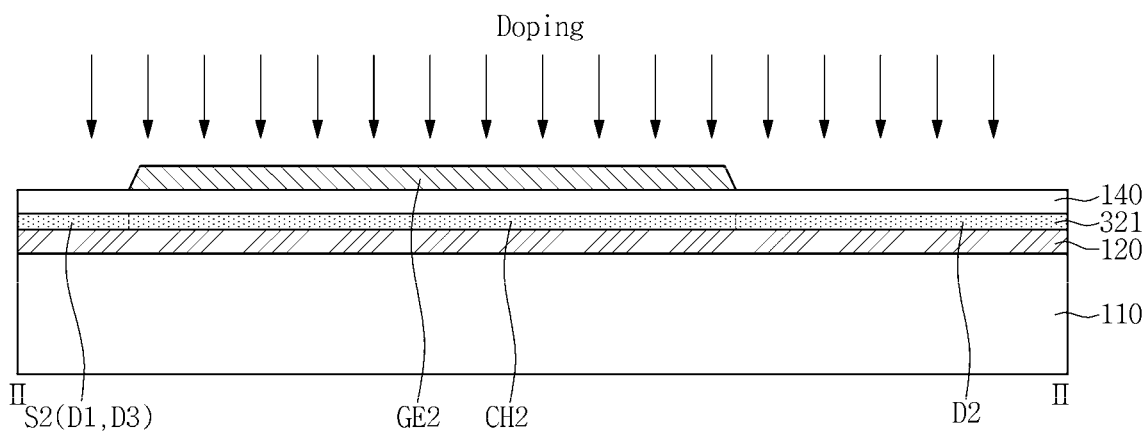
Figure 12C:
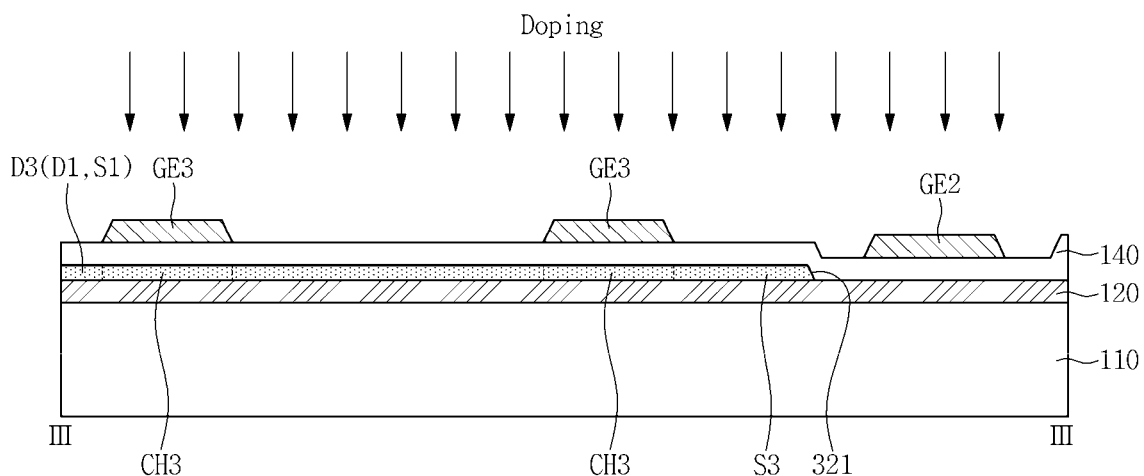

Subsequently, the aforementioned first metal layer is patterned through a photolithography process such that the first gate electrode GE1, the second gate electrode GE2, and the third gate electrode GE3 are formed on the gate insulating layer 140 as illustrated in FIGS. 10C, 11C, and 12C. Although not illustrated, the gate line GL is formed on the gate insulating layer 140 through this process. The first gate electrode GE1, the second gate electrode GE2, and the third gate electrode GE3 overlap the semiconductor layer 321.

Subsequently, an impurity ion doping process is performed using the first gate electrode GE1, the second gate electrode GE2, the third gate electrode GE3, and the gate line GL as a mask. Through the doping process, the first channel area CH1, the second channel area CH2, the third channel are CH3, the first source area S1, the first drain area D1, the second source area S2, the second drain area D2, the third source area S3, and the third drain area D3 are defined in the semiconductor layer 321. The first source area S1, the first drain area D1, the second source area S2, the second drain area D2, the third source area S3, and the third drain area D3, except the channel areas CH1, CH2, and CH3, may include the aforementioned impurity ions.

Figure 10D:
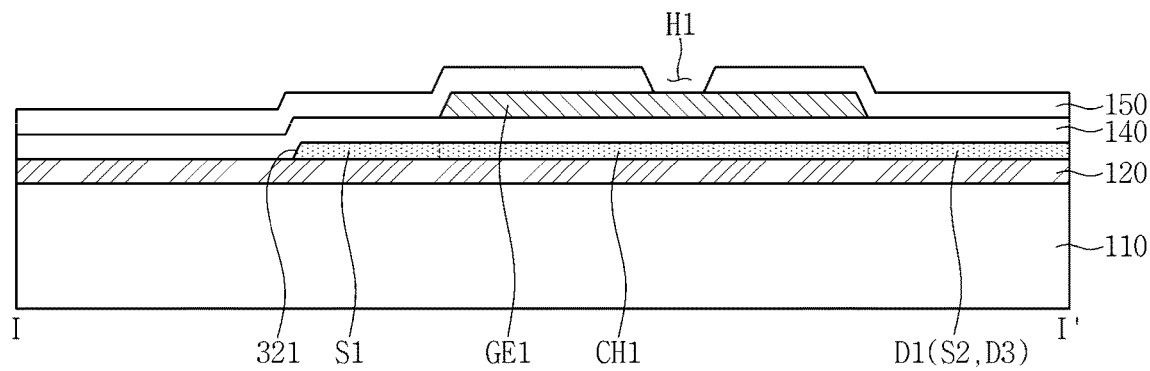
Figure 11D:
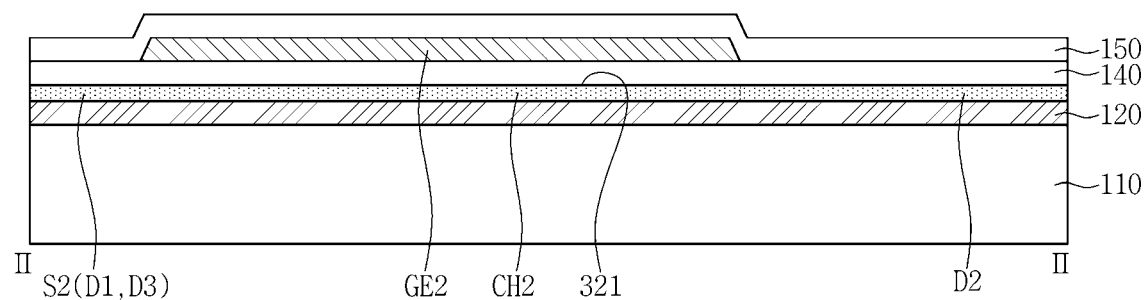
Figure 12D:
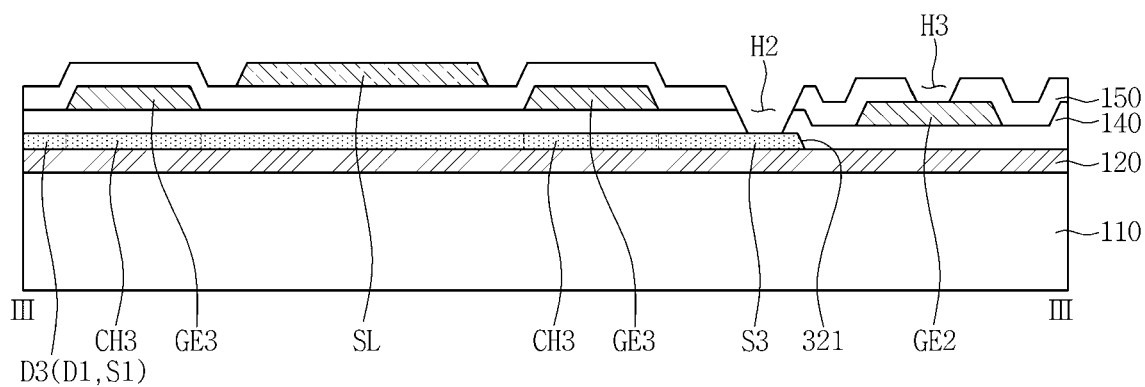

Subsequently, as illustrated in FIGS. 10D, 11D, and 12D, the first insulating interlayer 150 is formed over the entire surface of the substrate 110 including the first gate electrode GE1, the second gate electrode GE2, the third gate electrode GE3, the gate line GL, and the gate insulating layer 140. The first insulating interlayer 150 may be formed by a CVD method.

Subsequently, the first insulating interlayer 150 and the gate insulating layer 140 are removed in a selective manner through a photolithography process, and as illustrated in FIGS. 10D and 12D, the first contact hole H1 exposing the first gate electrode GE1, the second contact hole H2 exposing the third source area S3 of the semiconductor layer 321, and the third contact hole H3 exposing the second gate electrode GE2 are defined.

Subsequently, although not illustrated, a second metal layer is formed over the entire surface of the substrate 110 including the first insulating interlayer 150, the first contact hole H1, the second contact hole H2, and the third contact hole H3. The second metal layer may be formed by a PVD method such as sputtering or evaporating.

Figure 10E:
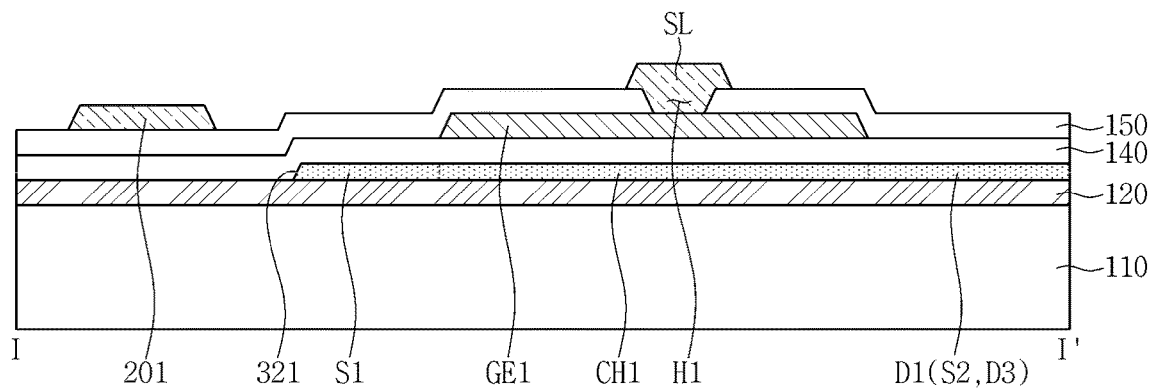
Figure 11E:
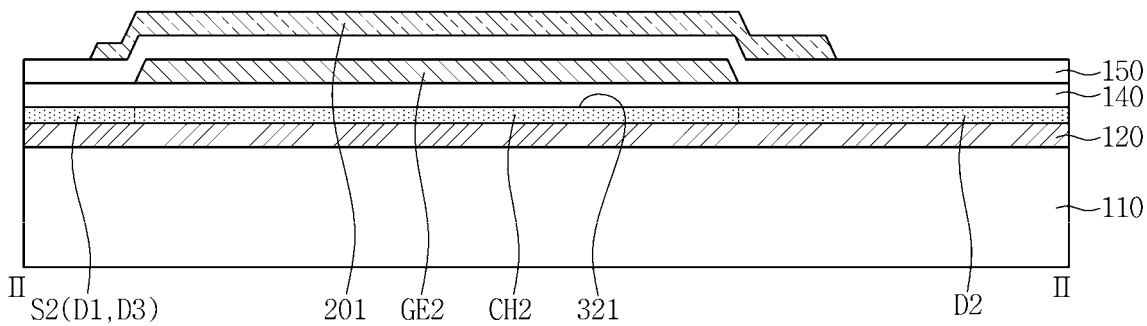
Figure 12E:
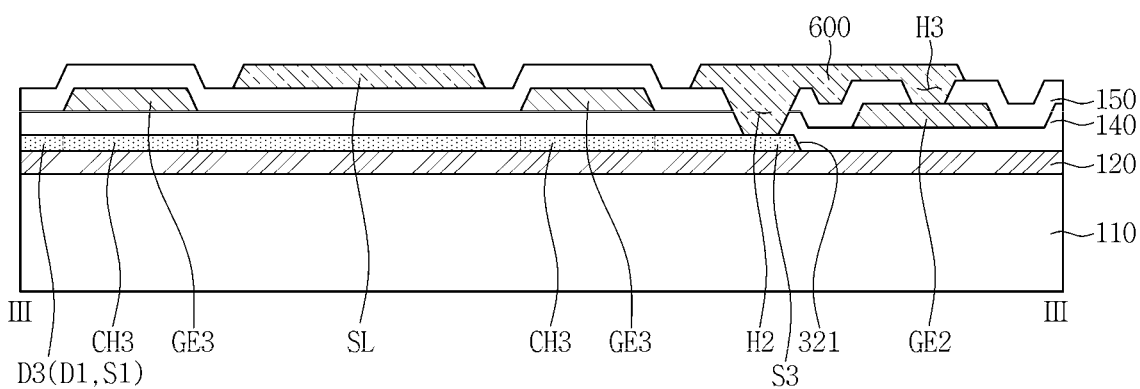

Subsequently, the aforementioned second metal layer is patterned through a photolithography process such that the first capacitor electrode 210, the scan line SL, and the connecting electrode 600 are formed on the first insulating interlayer 150 as illustrated in FIGS. 10E, 11E, and 12E. In such an exemplary embodiment, the scan line SL is connected to the first gate electrode GE1 through the first contact hole H1 as illustrated in FIG. 10E, and the connecting electrode 600 is connected to the third source area S3 of the semiconductor layer 321 and the second gate electrode GE2 through the second and third contact holes H2 and H3, respectively.

Figure 10F:
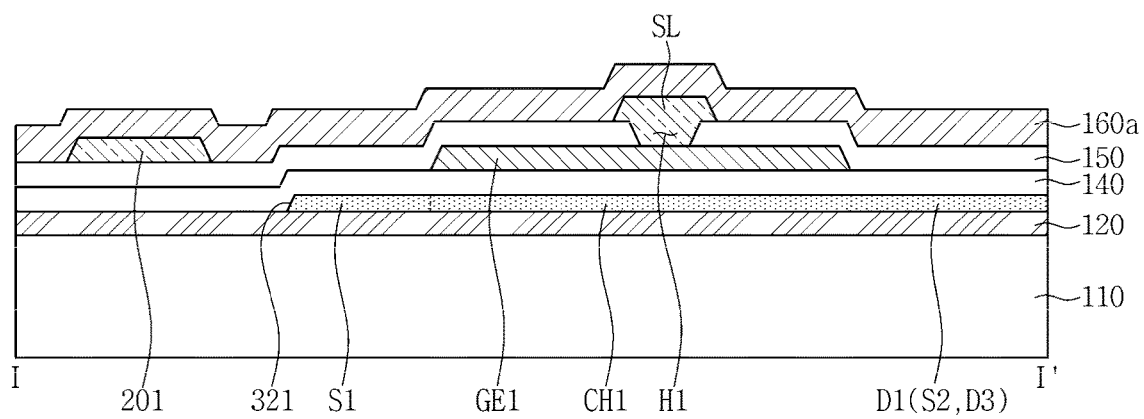
Figure 11F:
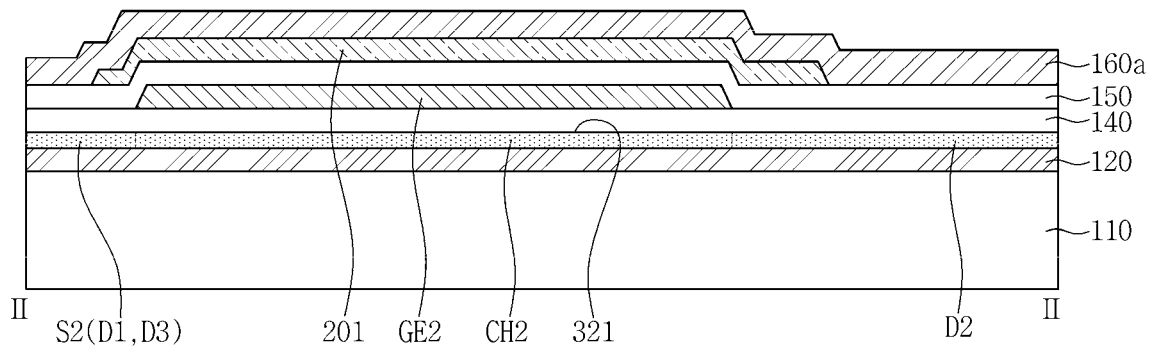
Figure 12F:
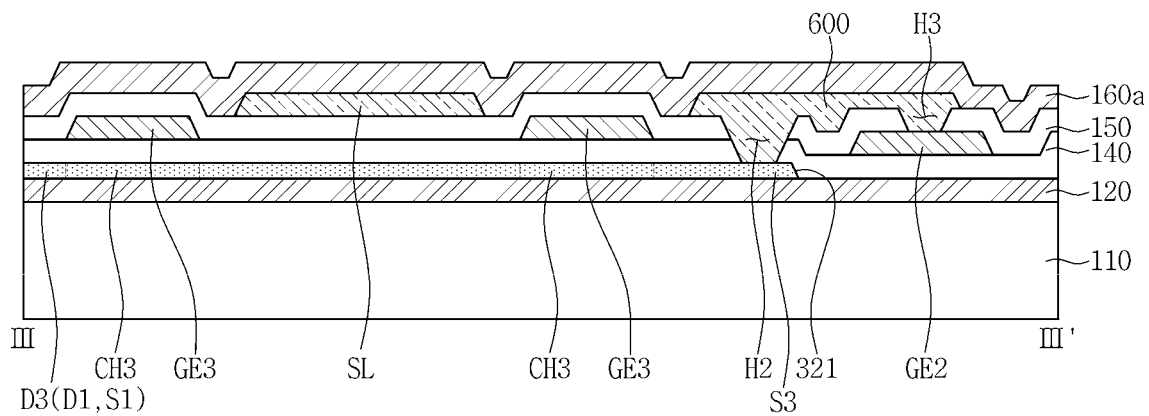

Subsequently, as illustrated in FIGS. 10F, 11F, and 12F, the first insulating layer 160a is formed over the entire surface of the substrate 110 including the first capacitor electrode 201, the scan line SL, the connecting electrode 600, and the first insulting interlayer 150. The first insulating layer 160a may be formed by a CVD method.

Figure 10G:
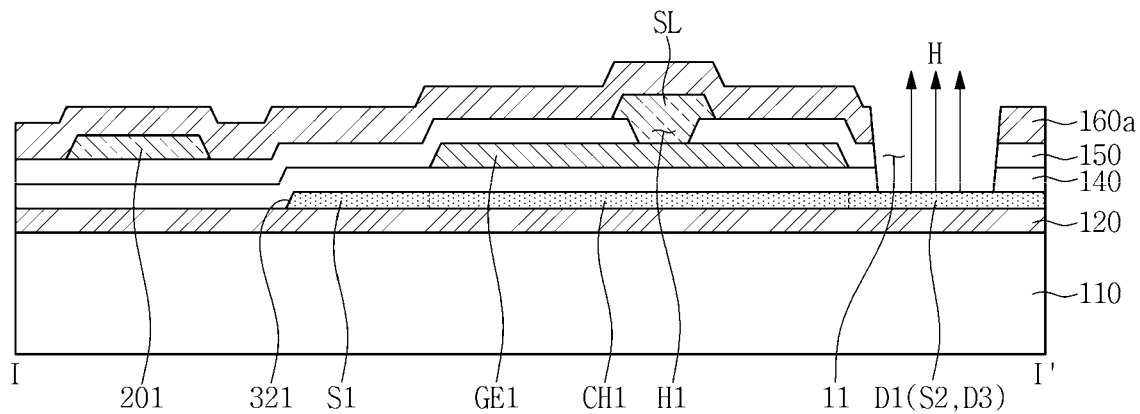
Figure 11G:
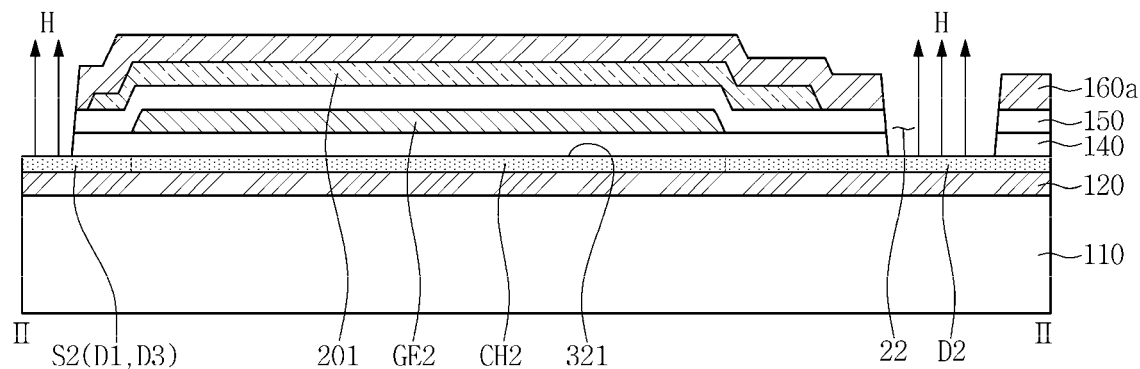

Subsequently, the first insulating layer 160a, the first insulating interlayer 150, and the gate insulating layer 140 are removed in a selective manner through a photolithography process such that the first dummy hole 11 exposing the first drain area D1 of the semiconductor layer 321 and the second dummy hole 22 exposing the second drain area D2 of the semiconductor layer 321 are defined as illustrated in FIGS. 10G, and 11G.

Subsequently, when the substrate 110 defined with the first and second dummy holes 11 and 12 is thermal-treated, hydrogen (H) of the semiconductor layer 321 is released outwards through the first and second dummy holes 11 and 22. That is, a dehydrogenation process of the semiconductor layer 321 is performed.

Figure 10H:
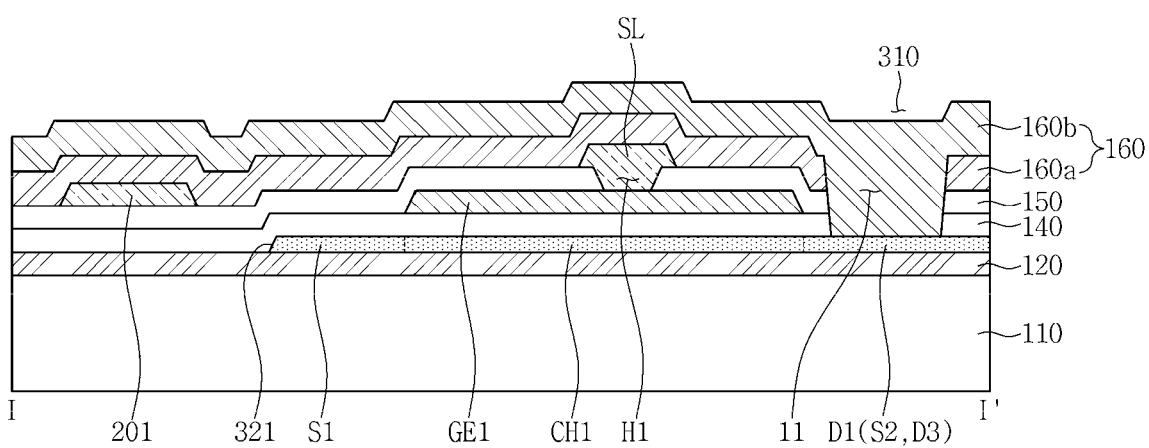
Figure 11H:
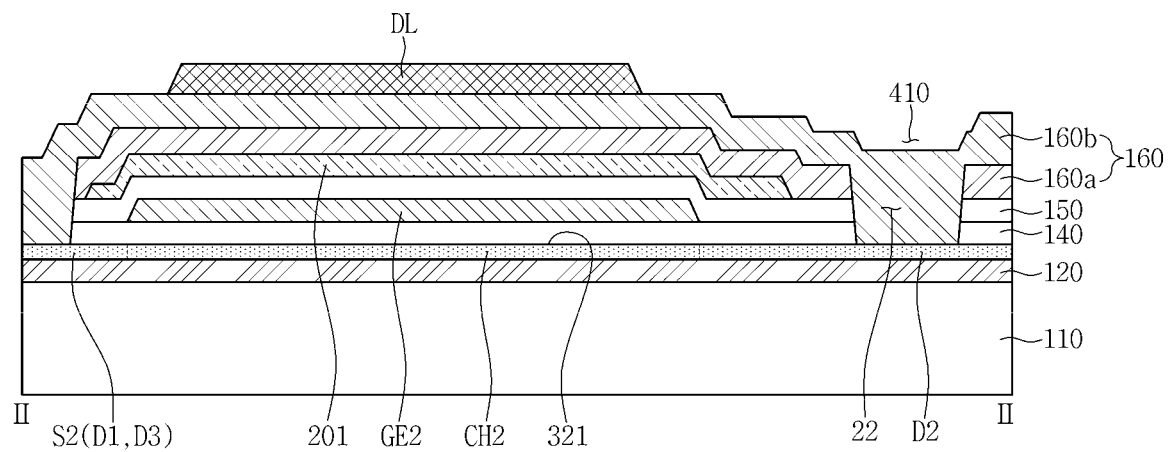
Figure 12G:
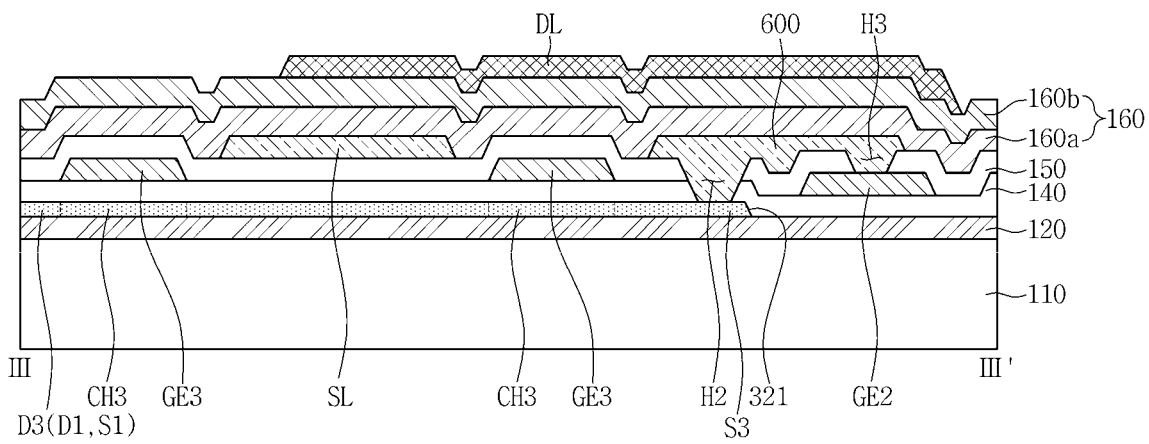

Subsequently, as illustrated in FIGS. 10H, 11H, and 12G, the second insulating layer 160b is formed over the entire surface of the substrate 110 including the first insulating layer 160a, the first dummy hole 11, and the second dummy hole 22. The second insulating layer 160b may be formed by a CVD method. The semiconductor layer 321 exposed through the first and second dummy holes 11 and 22 may be protected by the second insulating layer 160b.

In such an exemplary embodiment, due to the first dummy hole 11, the second insulating layer 160b above the first dummy hole 11 may have the groove 310 over the first dummy hole 11. In addition, due to the second dummy hole 22, the second insulating layer 160*b* above the second dummy hole 22 may have a concave portion 410 over the second dummy hole 22.

Subsequently, although not illustrated, a third metal layer is formed over the entire surface of the substrate 110 including the second insulating layer 160*b*. The third metal layer may be formed by a PVD method such as sputtering. The second metal layer may be formed of metal including aluminum.

Subsequently, the third metal layer is patterned through a photolithography process, and the data line DL is formed on the second insulating layer 160*b* as illustrated in FIGS. 11H and 12G.

Figure 10I:
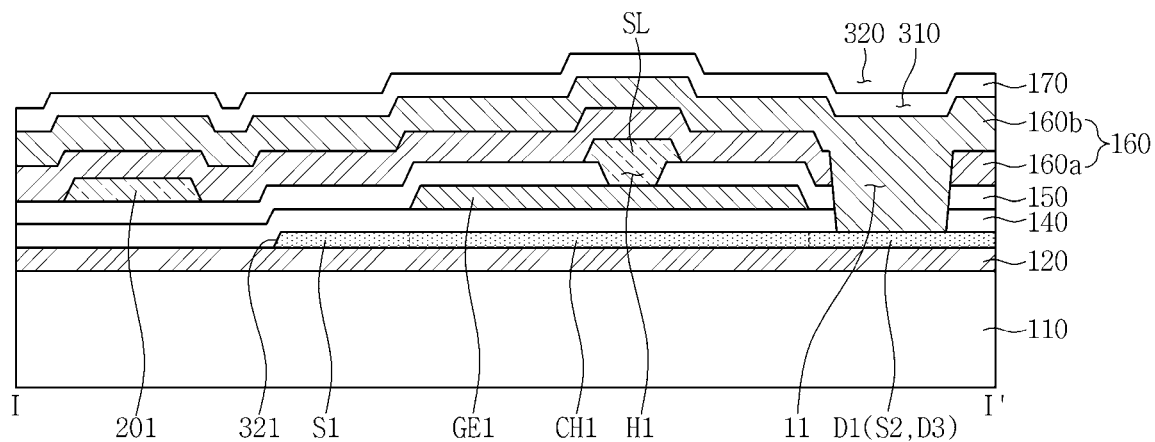
Figure 11I:
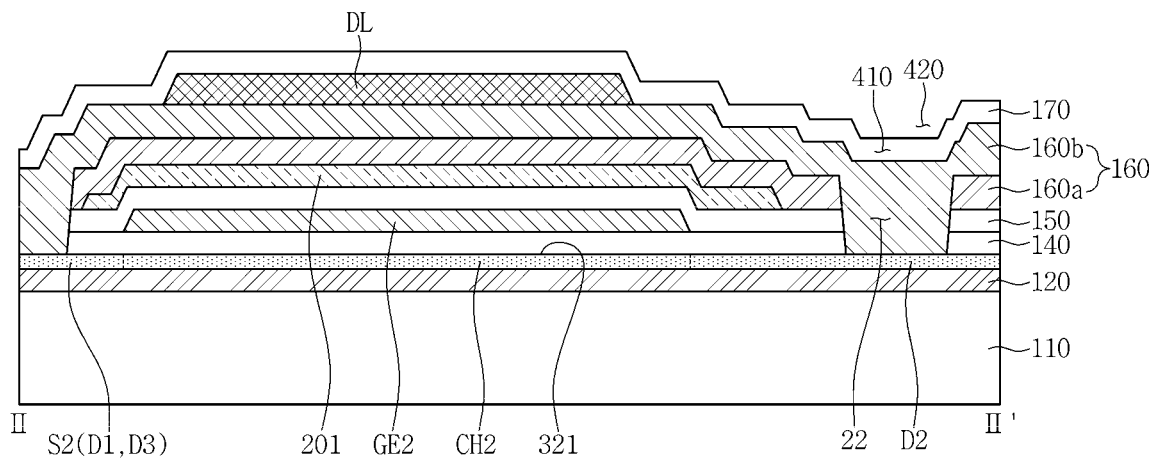
Figure 12H:
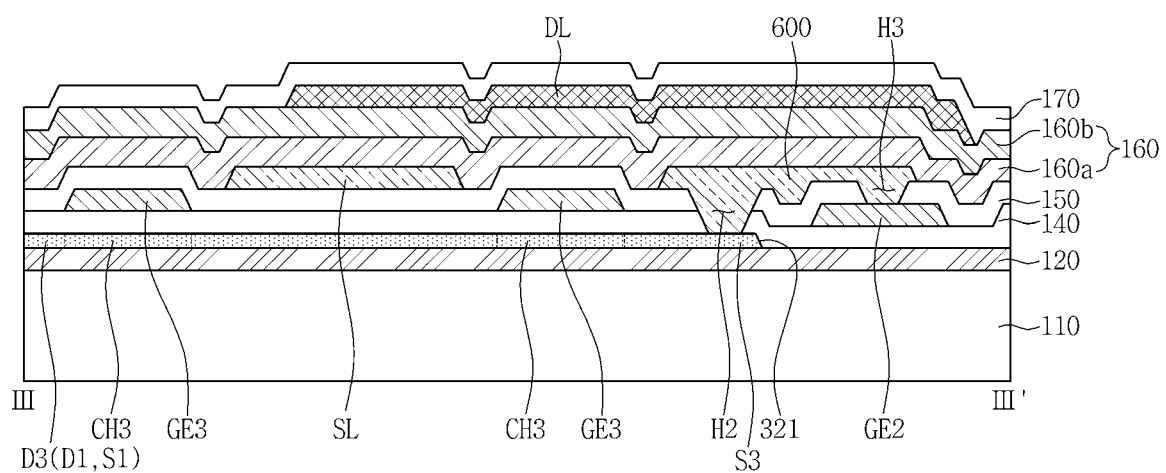

Subsequently, as illustrated in FIGS. 10I, 11I, and 12H, the third insulating interlayer 170 is formed over the entire surface of the substrate 110 including the data line DL and the second insulating layer 160*b*. The third insulating interlayer 170 may be formed by a CVD method.

Due to the first and second dummy holes 11 and 22, the third insulating interlayer 170 may have grooves 320 and 420 over the first dummy hole 11 and the second dummy hole 22, respectively.

Figure 10J:
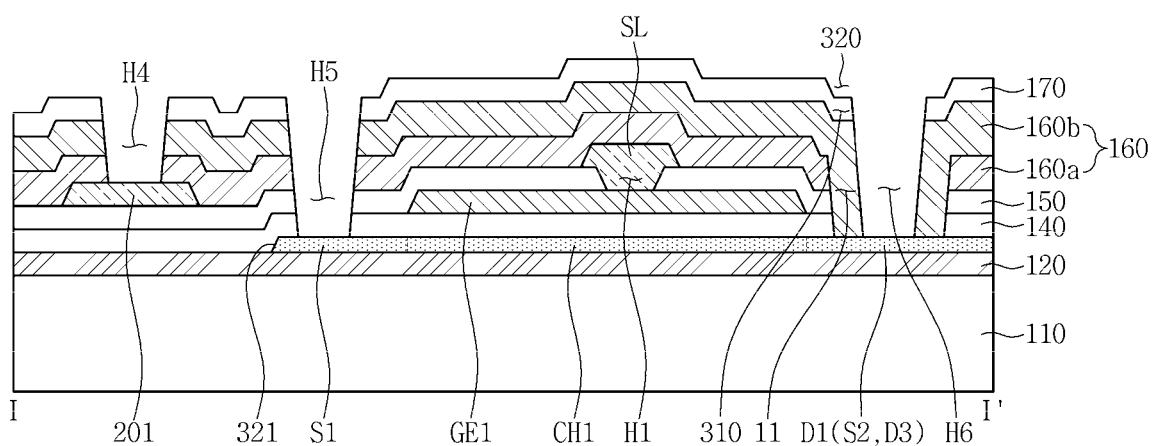
Figure 11J:
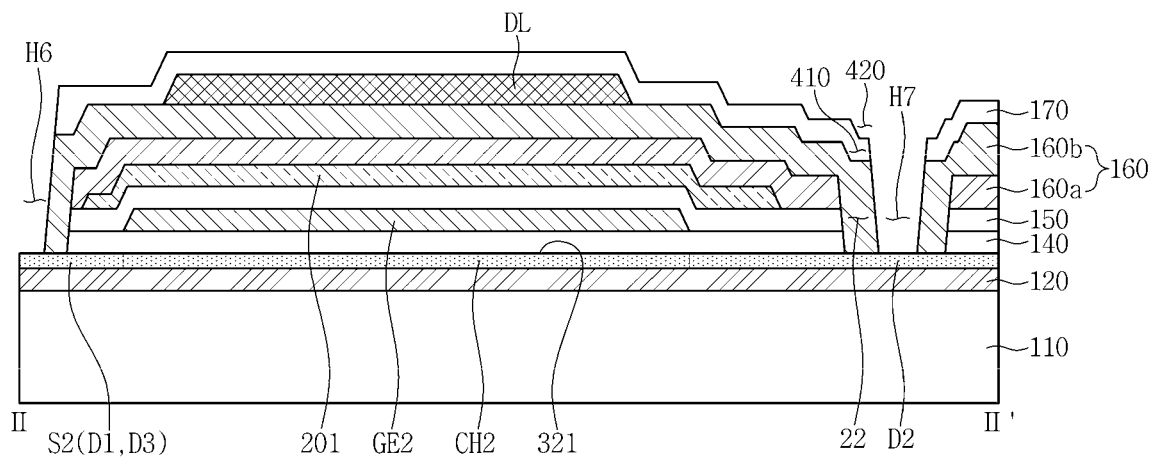

Subsequently, the third insulating interlayer 170, the second insulating interlayer 160 (160*a* and 160*b*), the first insulating interlayer 150, and the gate insulating layer 140 are removed in a selective manner through a photolithography process such that the fourth contact hole H4 exposing the first capacitor electrode 201, the fifth contact hole H5 exposing the first source area S1 of the semiconductor layer 321, the sixth contact hole H6 exposing the first drain area D1 of the semiconductor layer 321, and the seventh contact hole H7 exposing the second drain area D2 of the semiconductor layer 321 are defined as illustrated in FIGS. 10J and 11J.

Subsequently, although not illustrated, a fourth metal layer is formed over the entire surface of the substrate 110 including the third insulating interlayer 170, the fourth contact hole H4, the fifth contact hole H5, the sixth contact hole H6, and the seventh contact hole H7. The fourth metal layer may be formed by a PVD method such as sputtering or evaporating. The fourth metal layer may be formed of metal including aluminum.

Figure 10K:
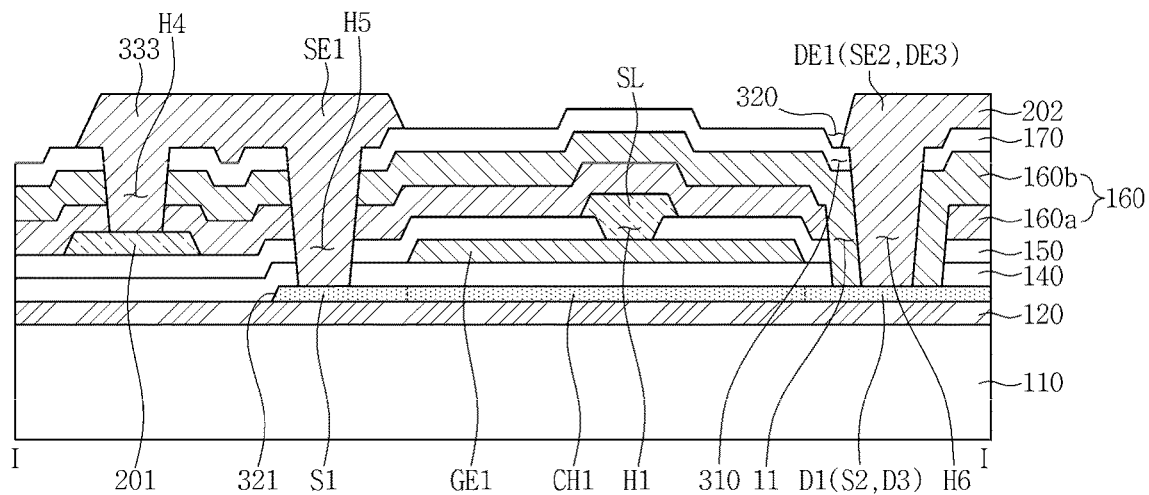
Figure 11K:
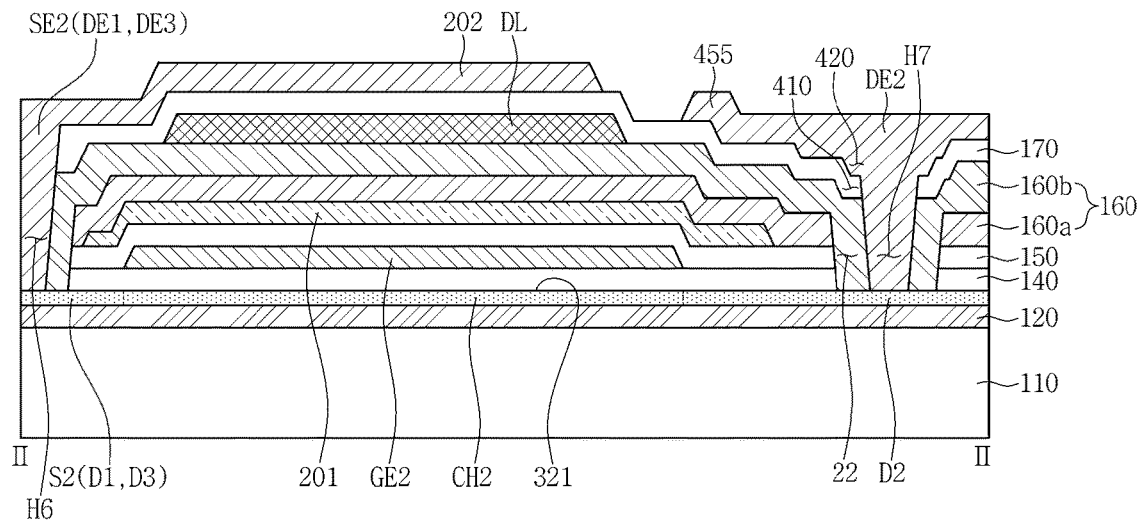

Subsequently, the fourth metal layer is patterned through a photolithography process, such that the initiating line 333, the first source electrode SE1, the first drain electrode DE1, the second capacitor electrode 202, the power supply line 455, the second drain electrode DE2 are formed on the third insulating interlayer 170 as illustrated in FIGS. 10K and 11K. The initiating line 333 is connected to the first capacitor electrode 201 through the fourth contact hole H4, the first source electrode SE1 is connected to the first source area S1 of the semiconductor layer 321 through the fifth contact hole H5, the first drain electrode DE1 is connected to the first drain area D1 of the semiconductor layer 321 through the sixth contact hole H6, and the second drain electrode DE2 is connected to the second drain area D2 of the semiconductor layer 321 through the seventh contact hole H7. In such an exemplary embodiment, the initiating line 333 and the first source electrode SE1 are connected to each other, the first drain electrode DE1 and the second capacitor electrode 202 are connected to each other, and the power supply line 455 and the second drain electrode DE2 are connected to each other.

Subsequently, as illustrated in FIGS. 4, 5, and 6, the planarization layer 180 is formed on the initiating line 333, the first source electrode SE1, the first drain electrode DE1, the second capacitor electrode 202, the power supply line 455, the second drain electrode DE2, and the third insulating interlayer 170.

Subsequently, the planarization layer 180 is removed in a selective manner through a photolithography process, such that the eighth contact hole H8 exposing the second capacitor electrode 202 is defined as illustrated in FIG. 5.

Subsequently, although not illustrated, a transparent conductive layer is formed over the entire surface of the substrate 110 including the planarization layer 180 and the eighth contact hole H8. The transparent conductive layer may be formed through a PVD method.

Subsequently, the transparent conductive layer is patterned through a photolithography process, such that the pixel electrode PE is formed on the planarization layer 180 as illustrated in FIGS. 4, 5, and 6. In such an exemplary embodiment, as illustrated in FIG. 5, the pixel electrode PE is connected to the second capacitor electrode 202 through the eighth contact hole H8.

Subsequently, as illustrated in FIGS. 4, 5, and 6, the pixel defining layer 190 is formed over the entire surface of the substrate 110 including the pixel electrode PE and the planarization layer 190.

Subsequently, the pixel defining layer 190 is removed in a selective manner through a photolithography process, such that the pixel area 111 exposing the pixel electrode PE is defined as illustrated in FIG. 5.

Subsequently, a light emitting material is deposited and then patterned through a photolithography process such that the light emitting layer 512 is formed on the pixel electrode PE in the pixel area 111 as illustrated in FIG. 5.

Subsequently, the common electrode 613 is formed over the entire surface of the substrate 110 including the light emitting layer 512 and the pixel defining layer 190.

Subsequently, as illustrated in FIGS. 4, 5, and 6, the sealing member 750 is formed on the common electrode 613. The sealing member 750 is formed over the entire surface of the substrate 110 including the common electrode 613.

As such, according to exemplary embodiments, dehydrogenation of the semiconductor layer 321 may be smoothly performed through a dummy hole. In such a case, a thermal treatment process for dehydrogenation is performed before a process of forming an electrode or a line that are disposed on the second insulating interlayer 160, and thus damage to, for example, the data line DL may be prevented. That is, each of the gate electrodes GE1, GE2, and GE3, the gate line GL, the scan line SL, the first capacitor electrode 201, and the connecting electrode 600 that are formed before the thermal treatment process do not include aluminum and thus may not be damaged by the thermal treatment process, while each source electrode, each drain electrode, and the data line that are formed after the thermal treatment process include aluminum and thus may not be damaged by the thermal treatment process. When the aluminum is heat treated during the dehydration process, aluminum hillock may occur in the aluminum layer. The aluminum hillock may damage the insulating layer to form a crack or a hole in the third insulating interlayer 170. Due to the crack or the hole formed in the third insulating interlayer 170, a cleaning solution may permeate into the data line DL through the crack or the hole and the data line may be damaged.

Exemplary embodiments of a display device may be a LED device that includes an LED as a display element. However, exemplary embodiments are not limited thereto, and an exemplary embodiment of a display device may be an LCD device that includes liquid crystals as a display element.

As set forth hereinabove, according to one or more exemplary embodiments, a display device and a method of manufacturing the display device may provide the following effects.

First, dehydrogenation of a semiconductor layer may be properly performed through a dummy hole.

Second, a thermal treatment process performed during the dehydrogenation is performed before a process of forming an electrode or a line disposed on a second insulating interlayer, and thus damage to an element, e.g., a data line, may be prevented.

From the foregoing, it will be appreciated that various embodiments in accordance with the present disclosure have been described herein for purposes of illustration, and that various modifications may be made without departing from the scope and spirit of the present teachings. Accordingly, the various embodiments disclosed herein are not intended to be limiting of the true scope and spirit of the present teachings. Various features of the above described and other embodiments can be mixed and matched in any manner, to produce further embodiments consistent with the inventive concept.

What is claimed is:

1. A display device comprising:
    a substrate;
    at least one switching element on the substrate;
    a pixel electrode connected to the at least one switching element;
    a semiconductor layer on the substrate, the semiconductor layer providing a channel area of the at least one switching element;
    a first insulating layer on the semiconductor layer, the first insulating layer having a contact hole and a groove on the contact hole;
    a conductive layer connected to the semiconductor layer through the contact hole; and
    a second insulating layer having a dummy hole surrounding the contact hole,
    wherein the groove is disposed between a first inner wall of the contact hole and a second inner wall of the dummy hole in a plan view.

2. The display device as claimed in claim 1, wherein the groove has a ring shape surrounding the conductive layer.

3. The display device as claimed in claim 2, further comprising a third insulating layer on the first insulating layer.

4. The display device as claimed in claim 3, wherein a portion of the third insulating layer in the groove has a ring shape.

5. The display device as claimed in claim 1, wherein the dummy hole further surrounds the conductive layer and the first insulating layer, and the dummy hole overlaps the groove.

6. The display device as claimed in claim 5, wherein the dummy hole has a ring shape surrounding the conductive layer in the contact hole.

7. The display device as claimed in claim 6, wherein a portion of the second insulating layer in the dummy hole has a ring shape.

8. The display device as claimed in claim 1, wherein the at least one switching element comprises:
    a gate electrode between the first insulating layer and the substrate; and
    a source electrode or a drain electrode on the first insulating layer, the source electrode or the drain electrode connected to the conductive layer.

9. The display device as claimed in claim 8, wherein the source electrode or the drain electrode are unitary with the conductive layer.

10. The display device as claimed in claim 1, further comprising:
    a common electrode on the pixel electrode; and
    a display element between the common electrode and the pixel electrode.

11. The display device as claimed in claim 10, wherein the display element comprises an organic light emitting element or liquid crystals.

12. The display device as claimed in claim 1, further comprising:
    a first capacitor connected to an initiating line on the first insulating layer through a first terminal of the first capacitor;
    a second capacitor connected between the pixel electrode and a data line; and
    a light emitting element connected between the pixel electrode and a common electrode.

13. The display device as claimed in claim 12, wherein the at least one switching element comprises:
    a first switching element comprising a gate electrode connected to a gate line, the first switching element connected between the initiating line and the pixel electrode;
    a second switching element comprising a gate electrode connected to a second terminal of the first capacitor, the second switching element connected between a driving power line and the pixel electrode; and
    a third switching element comprising a gate electrode connected to a scan line, the third switching element connected between the second terminal of the first capacitor and the pixel electrode.

14. The display device as claimed in claim 1, wherein a size of the groove is larger than a size of the contact hole.

15. The display device as claimed in claim 1, wherein the first insulating layer is in contact with the semiconductor layer in the dummy hole.

16. A display device comprising:
    a substrate;
    at least one switching element on the substrate;
    a pixel electrode connected to the at least one switching element;
    a semiconductor layer on the substrate, the semiconductor layer providing a channel area of the at least one switching element;
    a first insulating layer on the semiconductor layer, the first insulating layer having a dummy hole overlapping the semiconductor layer; and
    a second insulating layer in the dummy hole and on the first insulating layer, the second insulating layer having a groove overlapping the dummy hole,
    wherein only the second insulating layer is disposed in the dummy hole.

17. The display device as claimed in claim 16, wherein the at least one switching element comprises:
    a gate electrode between the second insulating layer and the substrate; and
    a source electrode or a drain electrode on the second insulating layer, the source electrode or the drain electrode connected to the semiconductor layer through contact holes of the first insulating layer and the second insulating layer.

18. The display device as claimed in claim 16, wherein the groove is smaller than the dummy hole.

\* \* \* \* \*